United States Patent
Kondo

(10) Patent No.: US 9,801,312 B2
(45) Date of Patent: Oct. 24, 2017

(54) DATA CENTER WITH AIR FLOW CONTROL

(71) Applicant: FUJITSU LIMITED, Kawasaki-shi, Kanagawa (JP)

(72) Inventor: Reiko Kondo, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 547 days.

(21) Appl. No.: 14/202,518

(22) Filed: Mar. 10, 2014

(65) Prior Publication Data
US 2014/0355203 A1 Dec. 4, 2014

(30) Foreign Application Priority Data
May 31, 2013 (JP) .................................. 2013-115635

(51) Int. Cl.
*G05B 13/00* (2006.01)
*H05K 7/20* (2006.01)

(52) U.S. Cl.
CPC ..... *H05K 7/20836* (2013.01); *H05K 7/20745* (2013.01)

(58) Field of Classification Search
CPC ........... H05K 7/20836; H05K 7/20745; G05B 13/0215
See application file for complete search history.

(56) References Cited

U.S. PATENT DOCUMENTS

| | | | | |
|---|---|---|---|---|
| 6,031,717 A | * | 2/2000 | Baddour | G06F 1/20 361/679.48 |
| 6,694,759 B1 | * | 2/2004 | Bash | G05D 16/202 236/49.3 |
| 7,676,280 B1 | * | 3/2010 | Bash | H05K 7/20836 700/17 |

(Continued)

FOREIGN PATENT DOCUMENTS

| | | |
|---|---|---|
| JP | 64-1368 | 1/1989 |
| JP | 6-249462 | 9/1994 |

OTHER PUBLICATIONS

Japanese Office Action dated Jan. 31, 2017 in related Japanese Application No. 2013-115635.

*Primary Examiner* — Robert Fennema
*Assistant Examiner* — Marzia T Monty
(74) *Attorney, Agent, or Firm* — Staas & Halsey LLP

(57) ABSTRACT

A data center that houses an electronic device, the data center includes a plurality of air-current-supply-sections that supply an air current to the electronic device, a plurality of shields that are provided for the air-current-supply-sections to shield corresponding air-current-supply-sections, and a control section that acquires status information indicative of a status of the electronic device from the electronic device, controls a flow rate of the air current supplied from each of the air-current-supply-sections in accordance with the acquired status information, checks the air-current-supply-sections to locate an air-current-supply-section whose air current flow rate is not higher than a predetermined value, checks the shields to locate a shield corresponding to the air-current-supply-section whose air current flow rate is not higher than the predetermined value, and causes the located shield to shield the located air-current-supply-section.

8 Claims, 19 Drawing Sheets

(56) References Cited

U.S. PATENT DOCUMENTS

| | | | | |
|---|---|---|---|---|
| 8,180,495 B1* | 5/2012 | Roy | H05K 7/20745 | |
| | | | 165/67 | |
| 8,374,725 B1* | 2/2013 | Ols | F24F 11/0012 | |
| | | | 261/118 | |
| 9,204,576 B2* | 12/2015 | Goulden | H05K 7/20736 | |
| 2006/0091229 A1 | 5/2006 | Bash et al. | | |
| 2009/0056359 A1* | 3/2009 | Germagian | H05K 7/20836 | |
| | | | 62/259.2 | |
| 2009/0140061 A1* | 6/2009 | Schultz | F24F 11/0012 | |
| | | | 236/51 | |
| 2009/0222139 A1* | 9/2009 | Federspiel | F24F 11/006 | |
| | | | 700/278 | |
| 2011/0093424 A1* | 4/2011 | Zimmermann | G05B 17/02 | |
| | | | 706/47 | |
| 2011/0128699 A1* | 6/2011 | Heydari | H05K 7/20745 | |
| | | | 361/679.48 | |
| 2011/0154842 A1* | 6/2011 | Heydari | H05K 7/20836 | |
| | | | 62/259.2 | |
| 2011/0203785 A1* | 8/2011 | Federspiel | G05D 22/02 | |
| | | | 165/200 | |
| 2012/0041600 A1* | 2/2012 | Michael | G05D 23/1932 | |
| | | | 700/276 | |
| 2012/0078422 A1* | 3/2012 | Mejias | H05K 7/20836 | |
| | | | 700/277 | |
| 2012/0101648 A1* | 4/2012 | Federspiel | G05D 23/1934 | |
| | | | 700/291 | |
| 2012/0136487 A1 | 5/2012 | Lin et al. | | |
| 2012/0167600 A1* | 7/2012 | Dunnavant | F24F 12/006 | |
| | | | 62/89 | |
| 2012/0185728 A1* | 7/2012 | Guo | F24F 11/0009 | |
| | | | 714/26 | |
| 2012/0247750 A1* | 10/2012 | Kobayashi | H05K 7/20836 | |
| | | | 165/287 | |
| 2012/0303164 A1* | 11/2012 | Smith | H04L 67/12 | |
| | | | 700/276 | |
| 2013/0062047 A1* | 3/2013 | Vaney | H05K 7/20836 | |
| | | | 165/287 | |
| 2013/0105107 A1* | 5/2013 | Chen | H05K 7/20745 | |
| | | | 165/11.1 | |
| 2013/0233532 A1* | 9/2013 | Imwalle | F28F 27/02 | |
| | | | 165/287 | |
| 2013/0238142 A1* | 9/2013 | Nichols | G05B 15/02 | |
| | | | 700/277 | |
| 2014/0092549 A1* | 4/2014 | Kodama | H05K 7/20745 | |
| | | | 361/679.48 | |

* cited by examiner

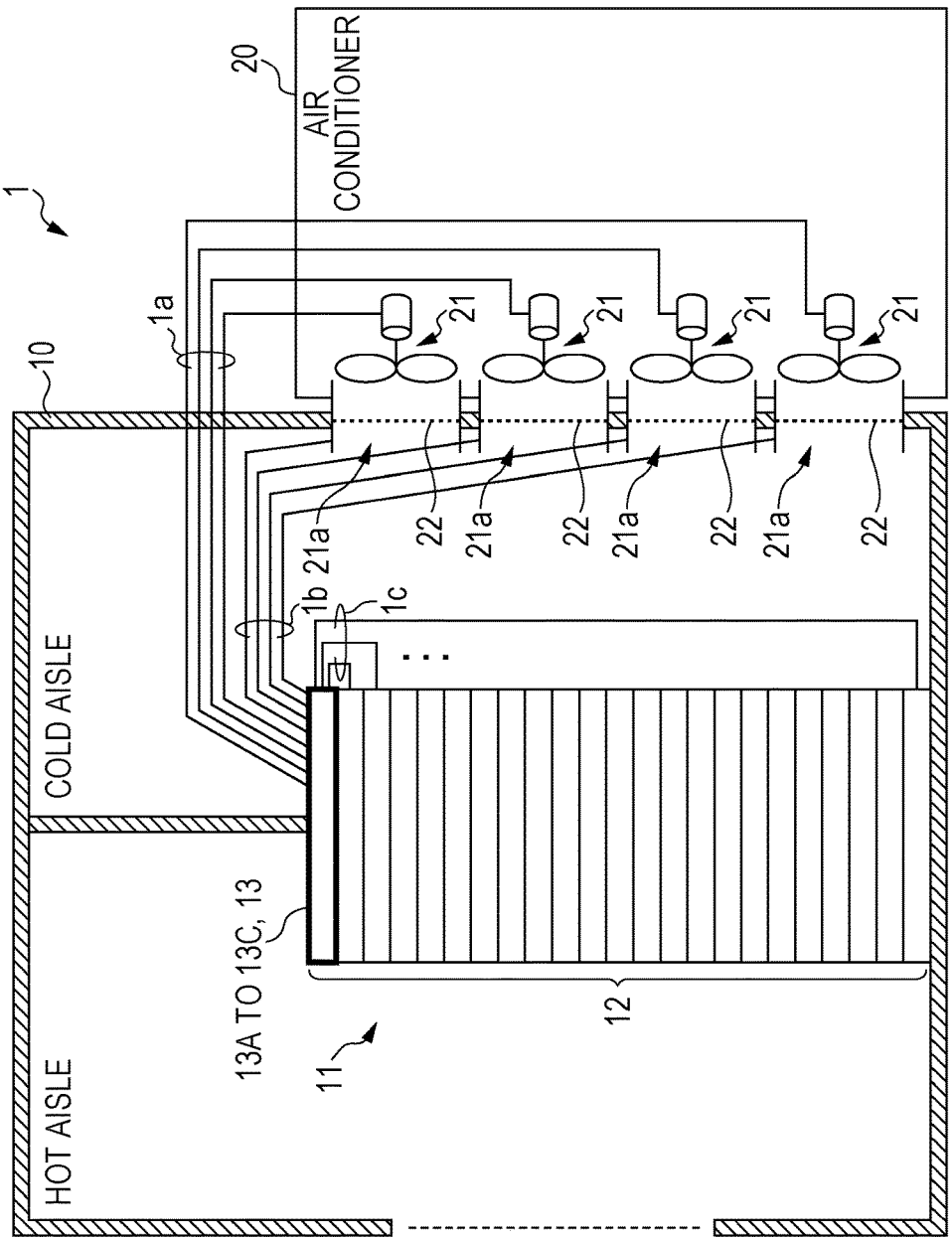

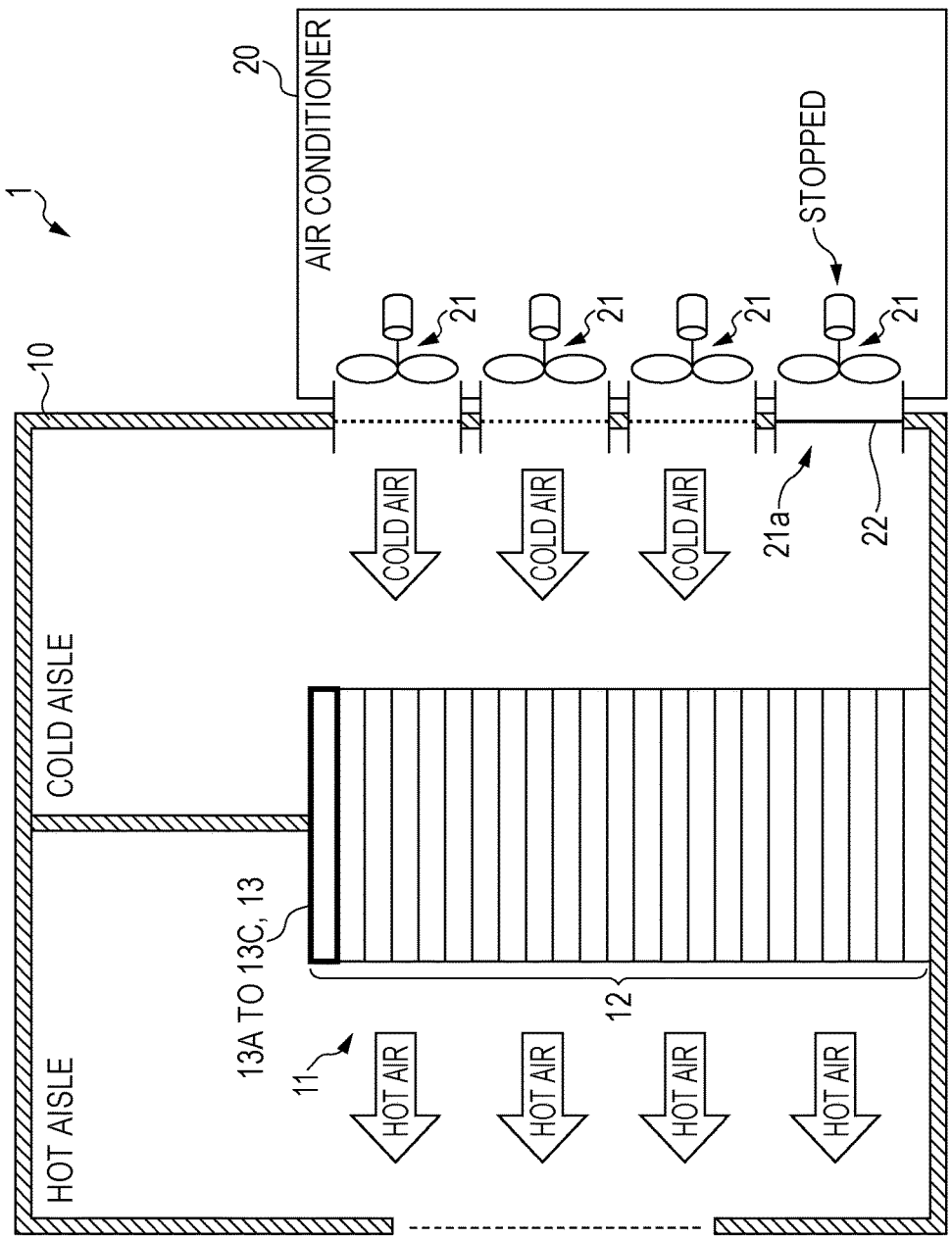

| RACK MOUNTING POSITION | SERVER ID | ASSOCIATED FAN ID |
|---|---|---|
| 40 | server39 | fan06 |
| 39 | server38 | fan06 |
| 38 | – | fan06, fan05 |
| ⋮ | ⋮ | ⋮ |
| 1 | server00 | fan00 |

| FAN ID | ROTATION SPEED (AIR AMOUNT) [%] | SHIELD OPEN/ CLOSE STATUS |
|---|---|---|
| fan00 | 90 | 0 |
| fan01 | 60 | 0 |
| fan02 | 0 | 1 |
| ⋮ | ⋮ | ⋮ |
| fan06 | 80 | 0 |

| GROUP ID | FAN ID | RACK MOUNTING POSITION |
|---|---|---|
| group00 | fan00, fan01 | 40, 39, ... , 26 |
| group01 | fan02, fan03, fan04 | 29, ... , 12 |
| group02 | fan05, fan06 | 15, ... , 01 |

| LOAD-CENTRALIZED GROUP ID | ROTATION SPEED (AIR AMOUNT) [%] | SHIELD OPEN/ CLOSE STATUS |
|---|---|---|
| group00 | F1: 90, F2: 75, F3: 0 | F1: 0, F2: 0, F3: 1 |
| group01 | : | : |
| group02 | : | : |

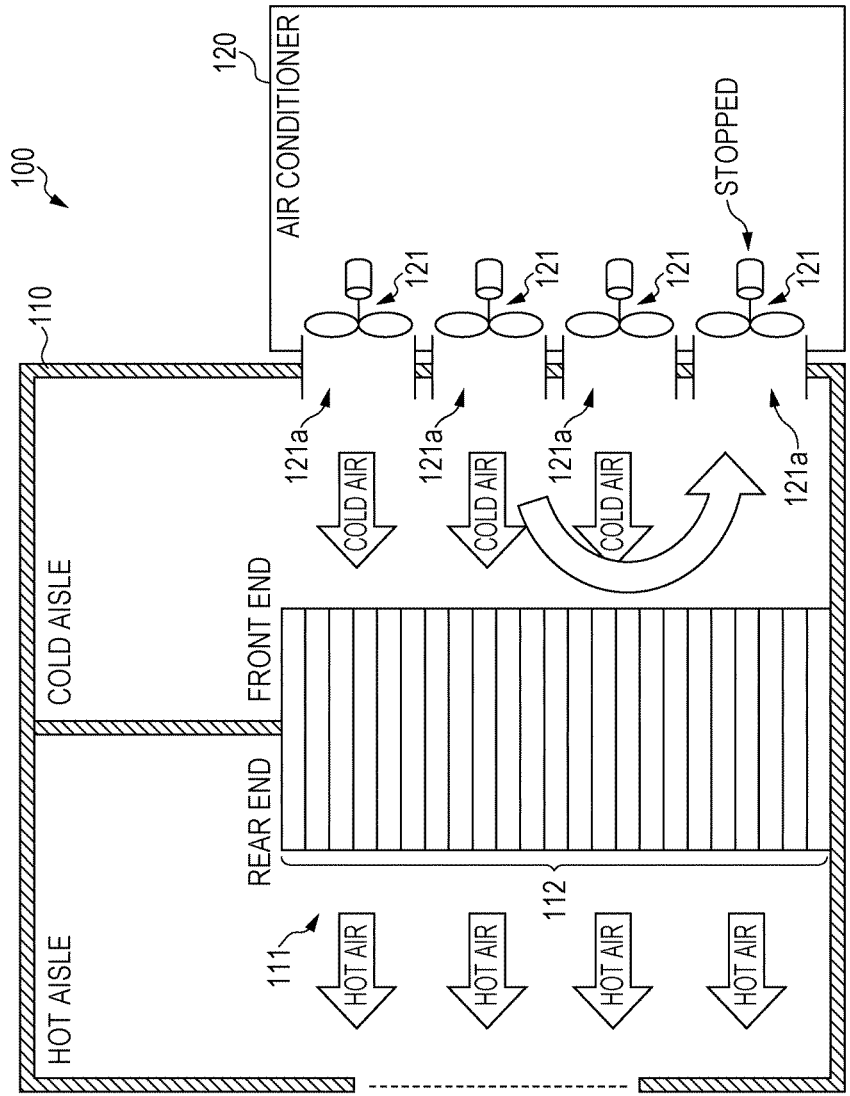

DATA CENTER WITH AIR FLOW CONTROL

CROSS-REFERENCE TO RELATED APPLICATION

This application is based upon and claims the benefit of priority of the prior Japanese Patent Application No. 2013-115635, filed on May 31, 2013, the entire contents of which are incorporated herein by reference.

FIELD

The embodiments discussed herein are related to a data center.

BACKGROUND

An air conditioner for cooling electronic devices and the like is often installed at a data center at which servers and other information processing devices, storage devices, communication devices, and other electronic devices are installed.

FIG. 23 is diagram illustrating an exemplary configuration of a container-type data center 100.

In recent years, the container-type data center 100 depicted in FIG. 23 is used. The container-type data center 100 includes a unit having a container 110 and an air conditioner 120. The container 110 houses one or more racks 111 on which servers 112 are mounted.

The container 110 is prepared by using, for example, a freight transport container as a base. The inside of the container 110 is divided into two zones, namely, a cold aisle and a hot aisle. One or more racks 111 are disposed between the cold aisle and the hot aisle.

The racks 111 are installed at a boundary between the cold aisle and the hot aisle. One or more servers 112 are mounted on the racks 111. The front end of the servers 112 mounted on the racks 111, which takes in air, is disposed toward the cold aisle, whereas the rear end of the servers 112 mounted on the racks 111, which discharges air, is disposed toward the hot aisle. The servers 112 take in cooling air (cold air) from the cold aisle, receive the cooling air (hot air) that has passed through the servers 112, and discharge the received hot air from the rear end disposed toward the hot aisle.

The air conditioner 120 is a device that generates cooling air for cooling the servers 112 mounted on the racks 111 in the container 110. The air conditioner 120 takes in outside air, for example, from the outside of the container-type data center 100 and introduces the outside air into the cold aisle of the container 110. The air conditioner 120 may include a heat exchanger that cools the outside air or air taken in from the hot aisle for the purpose of generating cooling air.

Further, the air conditioner 120 includes a plurality of (for example, four) fans 121 as depicted in FIG. 23.

The fans 121 are facility fans that are disposed in openings 121a formed in the wall of the container 110. The fans 121 generate an air current that passes through (cools) the one or more servers 112 mounted on the racks 111 and is forced out of the openings 121a. In the example depicted in FIG. 23, the fans 121 (openings 121a) are disposed in the container 110 to face the front end of the servers 112 mounted on the racks 111.

As the above-described configuration is employed, the servers 112 are able to take in the cooling air (cold air), which is blown onto the front end by the air conditioner 120 (the fans 121 facing the servers 112), from the cold aisle and discharge the cooling air from the rear end to the hot aisle. This ensures the servers 112 in the container-type data center 100 being cooled efficiently.

As related art, there is an air conditioner that includes an underfloor unit fan with a fan damper and adjusts the amount of air circulation by controlling the on/off operation of the unit fan and the degree of opening of the fan damper (refer, for example, to Japanese Laid-open Patent Publication No. 6-249462).

As another related art, there is a cooling fan device that opens or closes a shutter section provided at the air outlet of a fan in accordance with whether the fan is operating or stopped (refer, for example, to Japanese Laid-open Utility Model Application Publication No. 64-1368).

The air conditioner 120 provided for various data centers, including the container-type data center 100, is designed or selected on the presumption that information processing devices, storage devices, communication devices, and other electronic devices installed in the data centers, including the maximum number of servers 112, are operated at an operating rate of 100%. In reality, however, the maximum number of servers 112 are not installed at the data centers in many cases. Even when the maximum number of servers 112 are installed, some servers 112 are not operating at an operating rate of 100% in many cases. At a certain data center, for example, an operating rate of all the servers 112 may be approximately 30%.

If, as mentioned above, the actual number of servers or a server operating rate is lower than the number of servers or the server operating rate assumed when the air conditioner 120 is designed or selected, the air conditioner 120 excessively cools the inside of a data center and wastes an excessive amount of electrical power.

In order to reduce an excessive cooling operation performed by the air conditioner 120, a control device (not depicted in FIG. 23) for controlling the air conditioner 120, for example, may exercise control so as to decrease the rotation speed of the fans 121.

However, even when the control device decreases the rotation speed of the fans 121 to the lower-limit value of a setting range, the inside of the data center may still be excessively cooled in some cases. Further, when an adequate amount of cooling air is supplied to some highly loaded servers 112, the control device may not be able to decrease the rotation speed of the fans 121. Therefore, the electronic devices including the other servers 112 and the like may be excessively cooled in some cases.

Furthermore, when a certain fan 121 is stopped, the cold air supplied from operating fans 121 may return to the air conditioner 120 through an opening 121a for the stopped fan 121, as depicted in FIG. 24. FIG. 24 illustrates the flow of cooling air that results when a certain fan 121 depicted in FIG. 23 is stopped. If the opening 121a for the stopped fan 121 reverses the flow of air as depicted in FIG. 24, the operating fans fail to supply an adequate amount of cooling air to the electronic devices, including the servers 112 and the like. This reduces the effect of cooling of the electronic devices including the servers 112 and the like.

As described above, the data center has a problem in which the air conditioner 120 (fans 121) may consume an excessive amount of electrical power depending, for example, on the number of installed servers 112 and the operating rate thereof.

Although the data center has been described with reference to the container-type data center 100 depicted in FIG. 23, the above-mentioned problem may similarly occur at various data centers that house the racks 111 on which one or more servers 112 are mounted. The data center may be, for example, not only the container-type data center 100 but also a modular data center, which may be flexibly structured on an individual element basis, for example, in units of a building or an air conditioner, and a server rack having a cooling device. The data center may also be an Internet data center (IDC) or other facility-type data center.

An object of one aspect of the present disclosure is to efficiently cool electronic devices at a data center that houses the electronic devices.

In addition to the above object, producing advantageous effects that may be derived from configurations according to later-described embodiments and may not possibly be produced by related art may be defined as another object of the present disclosure.

SUMMARY

According to an aspect of the invention, a data center that houses an electronic device, the data center includes a plurality of air current supply sections that supply an air current to the electronic device; a plurality of shields that are provided for the air current supply sections to shield corresponding air current supply sections; and a control section that acquires status information indicative of a status of the electronic device from the electronic device, controls a flow rate of the air current supplied from each of the air current supply sections in accordance with the acquired status information, checks the air current supply sections to locate an air current supply section whose air current flow rate is not higher than a predetermined value, checks the shields to locate a shield corresponding to the air current supply section whose air current flow rate is not higher than the predetermined value, and causes the located shield to shield the located air current supply section.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a diagram illustrating an exemplary configuration of a container-type data center according to an embodiment;

FIG. 2 is a diagram illustrating how cooling air flows when a certain fan depicted in FIG. 1 is stopped with its shield closed;

FIG. 7 is a diagram illustrating an example of a server management table retained by the management server depicted in FIG. 1;

FIG. 8 is a diagram illustrating an example of an air amount management table retained by the management server depicted in FIG. 1;

FIG. 24 is a diagram illustrating how the cooling air flows when a certain fan depicted in FIG. 23 is stopped.

DESCRIPTION OF EMBODIMENTS

Figure 3A:
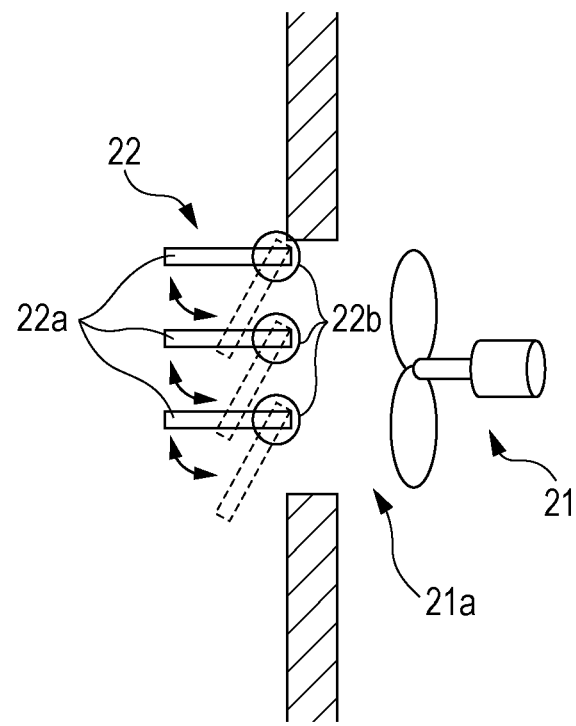
FIG. 3A is a cross-sectional view of an opening depicted in FIG. 1

Hereinafter, an embodiment is described with reference to the accompanying drawings.

[1] Embodiment

[1-1] Configuration of Data Center

The configuration of a data center 1 according to an embodiment is now described with reference to FIG. 1.

FIG. 1 is a diagram illustrating an exemplary configuration of a container-type data center 1 according to the embodiment.

As depicted in FIG. 1, the container-type data center 1, which is an example of the data center 1 according to the embodiment, includes a container 10 and an air conditioner 20. Hereinafter, the container-type data center 1 is simply referred to as the data center 1.

The container 10 is based, for example, on a freight transport container and used to house one or more racks 11. As depicted in FIG. 1, the inside of the container 10 is divided into two zones, namely, a cold aisle and a hot aisle. The racks 11 are disposed between the cold aisle and the hot aisle.

Further, the container 10 has an opening in the cold aisle. The opening is disposed at a position into which air discharged from the air conditioner 20 flows, and is used to let the container 10 communicate with the air conditioner 20 (air outlets of later-described fans 21).

The container 10 also includes an opening that is provided in the hot aisle. This opening (see the broken line portion of the hot aisle in FIG. 1) functions so that exhaust air (hot air) from servers 12 and other electronic devices is discharged out of the container 10. The opening in the hot aisle may discharge the exhaust air from the servers 12 to the outside of the data center 1. Alternatively, the opening in the host aisle may direct the exhaust air from the servers 12 to the air conditioner 20 through a blower pipe (not depicted) so that the exhaust air from the servers 12 is cooled by the air conditioner 20 and reused as cooling air.

The racks 11 are disposed at a boundary between the cold aisle and the hot aisle. One or more servers 12 (a plurality of servers 12 in the example depicted in FIG. 1) are mounted on each rack 11.

The servers 12 are mounted on the racks 11 in such a manner their front end, which takes in air, faces the cold aisle whereas their rear end, which discharges air, faces the hot aisle. The servers 12 take in the cooling air (cold air) from the cold aisle and discharge the cooling air (hot air), which has passed through the servers 12, from the rear end disposed toward the hot aisle.

A computer (information processing device) of any architecture, such as a personal computer (PC) server, a UNIX® server, or a main frame, may be used as the servers 12. Further, the container 10 may include not only an information processing device such as a server 12, but also various electronic devices such as a storage device for storing data of the information processing device, a switch, a router, or other communication device for connecting the information processing device to a network, and a power supply such as an uninterruptible power supply (UPS). These electronic devices may be mounted on the racks 11 or installed at any location within the container 10. Furthermore, the servers 12 may use various types of housing such as a rack-mount type, a tower type, and a blade type.

At least one of the servers 12 depicted in FIG. 1 not only manages the electronic devices such as the servers 12, but also functions as a management server 13 that controls the air conditioner 20 (later-described fans 21 and shields 22). The management server 13 functions as a management server 13A in the embodiment and functions as management servers 13B, 13C in the first and second modifications described later. In the subsequent description, the term "management server 13" is used when the management servers 13A to 13C are not distinguished from each other.

The management server (control section) 13 is connected to each of the electronic devices including the fans 21, the shields 22, and the servers 12 in such a manner that signals may be exchanged. More specifically, the management server 13 is connected to each of a plurality of fans 21 through a control line 1a, and controls the rotation speed of each fan 21 through the control line 1a. Further, the management server 13 is connected to each of a plurality of shields 22 through a control line 1b, and exercises control to open or close each shield 22. Further, the management server 13 is connected to the electronic device, including the servers 12, through a communication line 1c, and not only manages, for example, the operations of the electronic device, including the servers 12, through the communication line 1c, but also acquires various items of status information such as the internal temperature and operating rate of the electronic devices, including the servers 12, through the communication line 1c. For the sake of brevity of illustration, a part of the communication line 1c is omitted from the example of FIG. 1.

The servers 12 (management server 13) is described in detail later.

The air conditioner 20 generates cooling air for cooling the servers 12 and other electronic devices mounted on the racks 11 in the container 10. The air conditioner 20 takes in outside air, for example, from the outside of the data center 1 and introduces the outside air into the cold aisle of the container 10. The air conditioner 20 may include a heat exchanger, use the heat exchanger to cool the outside air or the air taken in from the hot aisle for the purpose of generating cooling air.

Further, as depicted in FIG. 1, the air conditioner 20 includes a plurality of (four in the example of FIG. 1) fans 21 and shields 22 that adjust the pressure in the container 10.

The fans (air current supply sections) 21 are each disposed in an opening 21a formed in the wall of the container 10 and provided as facility fans that generate an air current to the electronic devices (an air current that passes through the electronic devices for cooling purposes) and supply the air current through the opening 21a. The rotation speeds (air amounts) of the fans 21 are controlled by the management server 13 through the control line 1a. The opening 21a is provided in a cold aisle side orifice in the container 10. The fans 21 may be additionally disposed at a location in order to cool electronic devices installed outside the racks 11.

Propeller fans, sirocco fans, or various other fans may be used as the used as the fans 21. The container 10 has been described as a container that is capable of housing various electronic devices. For the brevity of explanation, however, the container 10 is hereinafter described as an electronic device that incorporates the servers 12 in the racks 11. It is assumed, as depicted in FIG. 1, that the fans 21 (openings 21a) are positioned in the container 10 so as to face the front end of the servers 12 in the racks 11.

The type and the number of fans 21 are selected for the air conditioner 20 so that the air conditioner 20 properly functions (cools the servers 12 to a predetermined temperature) even when the servers 12 or other electronic devices are mounted in the container 10 or at all mounting positions of the racks 11 and all the servers 12 (or the electronic devices) operate. However, as mentioned earlier, the air conditioner 20 may excessively cool the servers 12 and other electronic devices and waste an excessive amount of electrical power depending on the number of mounted servers 12 and on the operating rate thereof.

Further, as mentioned earlier, even when a certain fan 21 is stopped to reduce the amount of wasted electrical power, the opening 21a for the stopped fan 21 may reverse the flow of air supplied from the operating fans 21 and direct the air back to the air conditioner 20 as explained with reference to FIG. 24.

As such being the case, the data center 1 according to the embodiment includes shutters (shields 22) that cover the fans 21 (the openings 21a in the container 10).

The shields 22 are respectively provided for the fans 21 to shield the related fans 21. The management server 13 exercises control through the control line 1b to open or close the shields 22.

FIG. 2 is a diagram illustrating how the cooling air flows when a certain fan 21 depicted in FIG. 1 is stopped with its shield 22 closed.

When a certain fan 21 (the lowermost fan 21 depicted in FIG. 2) is stopped with its shield 22 closed, as depicted in FIG. 2, the shield 22, which is disposed as described above, makes it possible to inhibit the cold air supplied from the air conditioner 20 from flowing backward through the opening 21a for the stopped fan 21. This reduces the loss of cold air that is taken in from the operating fans 21 by the servers 12.

Figure 3B:
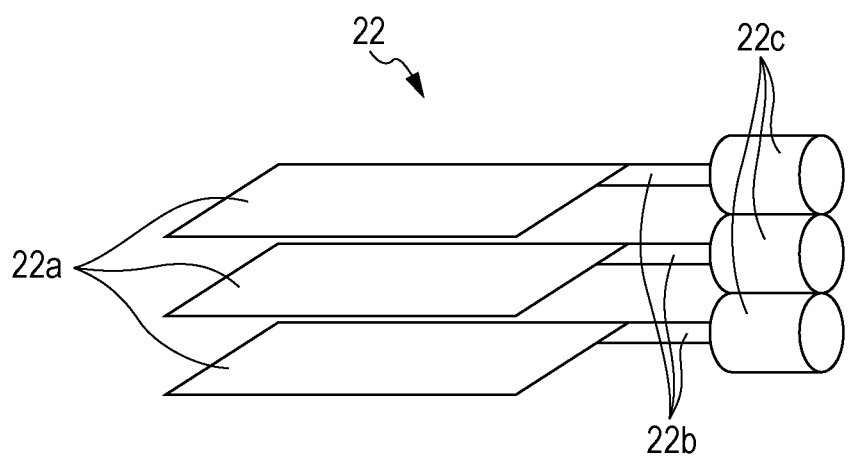
FIG. 3B is a diagram illustrating an exemplary configuration of the shield.
Figure 4A:
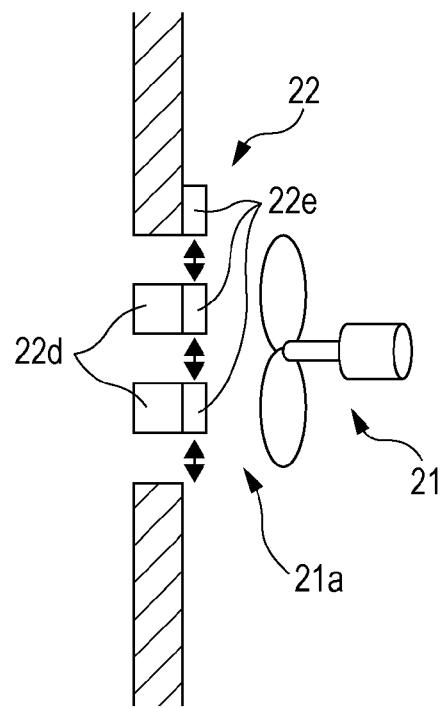
FIG. 4A is a cross-sectional view of the opening depicted in FIG. 1
Figure 4B:
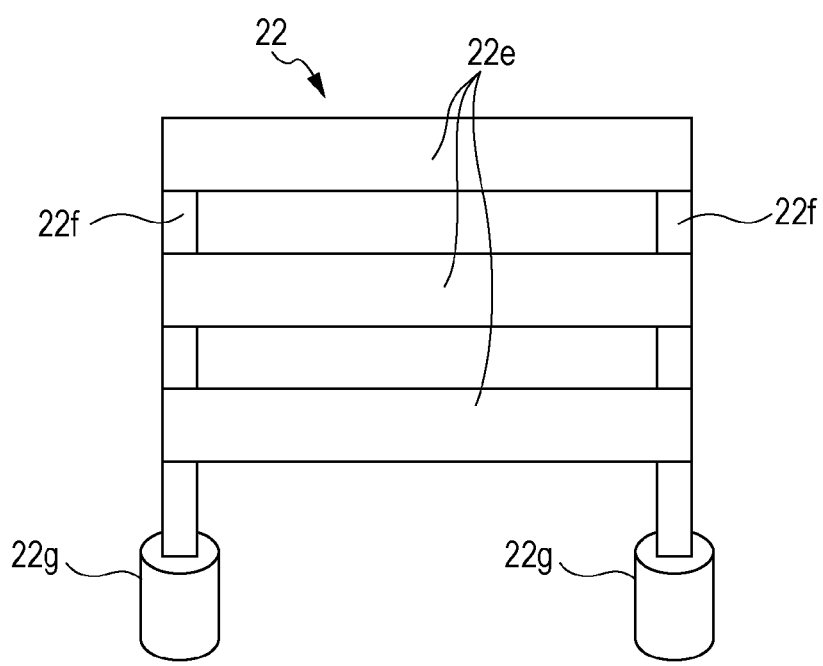
FIG. 4B is a diagram illustrating an exemplary configuration of the shield.

FIGS. 3A, 3B, 4A, and 4B are diagrams illustrating the shields 22. More specifically, FIGS. 3A and 4A are exemplary cross-sectional views of the openings 21a depicted in FIG. 1. FIGS. 3B and 4B are diagrams illustrating exemplary configurations of the shields 22 depicted in FIG. 1.

The shield 22 depicted, for example, in FIG. 3B includes one or more (three in the example of FIG. 3B) flat louvers 22a, rotary shafts 22b secured to the louvers 22a, and electric motors 22c that function as a mechanism for rotating the rotary shafts 22b.

When the shields 22 are of a louver rotation type, the rotation of the electric motors 22c is controlled in accordance with a command from the management server 13. In this instance, the management server 13 is capable of rotating the louvers 22a (rotary shafts 22b) to let the louvers 22a cover an opening 21a by controlling the one or more electric motors 22c as depicted in FIG. 3A.

The shields 22 may alternatively be of a shutter slide type depicted in FIGS. 4A and 4B. When the shields 22 are of the shutter slide type, each shield 22 includes one or more (two in the example of FIG. 4A) flat fixed shielding plates 22d that are attached to the area of the opening 21a in such a manner as to traverse the opening 21a as depicted in FIG. 4A. When a plurality of fixed shielding plates 22d are used, they are secured to the area of the opening 21a with a predetermined clearance provided relative to the neighboring fixed shielding plates 22d.

Further, as depicted in FIG. 4B, each shield 22 includes one or more (three in the example of FIG. 4B) flat movable shielding plates 22e. Each shield 22 also includes two plungers 22f and two solenoids 22g. The plungers 22f are disposed on both longitudinal ends of the movable shielding plates 22e and oriented in a direction orthogonal to the longitudinal direction. The solenoids 22g move the plungers 22f in a direction orthogonal to the longitudinal direction.

When the shields 22 are of the shutter slide type, the solenoids 22g of each shield 22 are driven in accordance with a command from the management server 13. In this instance, the management server 13 is capable of driving the two solenoids 22g to slide the movable shielding plates 22e (plungers 22f) as depicted in FIG. 4A until the movable shielding plates 22e cover a space between one or more fixed shielding plates 22d and the rim of the opening 21a. Either one of the two plungers 22f and of the two solenoids 22g may be omitted.

As described above, the shields 22 are capable of covering the fans 21 as depicted in FIGS. 3A, 3B, 4A, and 4B. Therefore, even when a certain fan 21 is stopped, it is possible to inhibit the cooling air supplied from the operating fans 21 from flowing backward through the opening 21a related to the stopped fan 21 (see FIG. 24). It is not demanded that the louvers 22a or movable shielding plates 22e of each shield 22 completely close the opening 21a related to the stopped fan 21. Even if the opening 21a related to the stopped fan 21 is not completely closed, it is possible to adequately inhibit the air supplied from the operating fans 21 from flowing backward.

The positions and orientations of the louvers 22a, the fixed shielding plates 22d, and the movable shielding plates 22e are not limited to those indicated by the examples of FIGS. 3A, 3B, 4A, and 4B. Their positions and orientations may be variously modified.

[1-2] Server Configuration

The servers 12 (including the management server 13) is now described in detail with reference to FIGS. 5 and 6.

[1-2-1] Hardware Configuration

Figure 5:
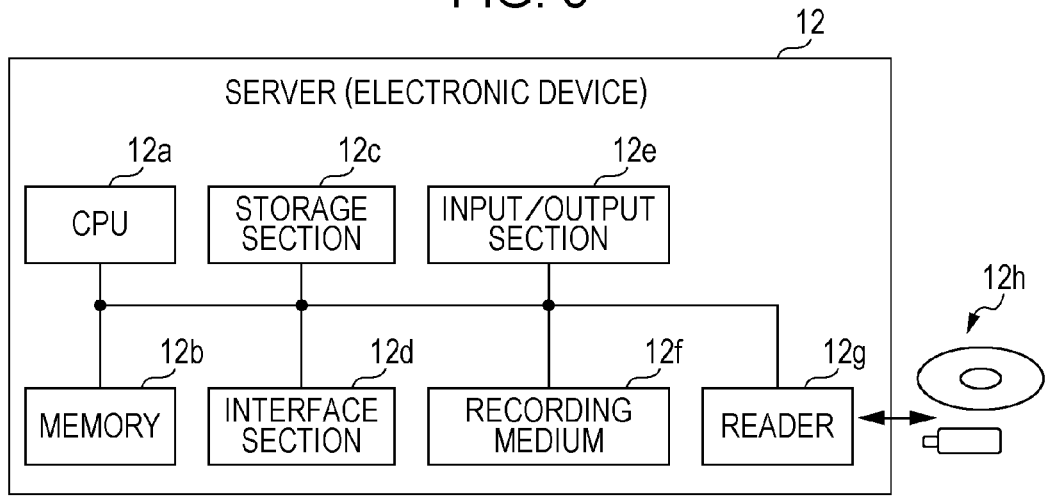
FIG. 5 is a diagram illustrating an exemplary hardware configuration of a server depicted in FIG. 1.

FIG. 5 is a diagram illustrating an exemplary hardware configuration of the servers 12 depicted in FIG. 1.

As depicted in FIG. 5, the servers 12, including the management server 13, each include a central processing unit (CPU) 12a, a memory 12b, a storage section 12c, an interface section 12d, an input/output section 12e, a recording medium 12f, and a reader 12g. The servers 12 depicted in FIG. 1 may have the same hardware. Therefore, the hardware included in the management server 13 is now described as a representative.

The CPU 12a is an arithmetic processing unit (processor) that is connected to the memory 12b, the storage section 12c, the interface section 12d, the input/output section 12e, the recording medium 12f, and the reader 12g to perform various control and computation processes. The CPU 12a implements various functions of the management server 13 by executing a program stored, for example, in the memory 12b, in the storage section 12c, on the recording medium 12f, on a recording medium 12h connected to or inserted into the reader 12g, or in a read-only memory (ROM) that is not depicted. The processor to be used is not limited to the CPU 12a. A micro-processing unit (MPU) or other similar electronic circuit may be used as the processor.

The memory 12b is a storage device that stores various data and programs. When executing a program, the CPU 12a stores and deploys data and the program in the memory 12b. For example, a random-access memory (RAM) or other volatile memory may be used as the memory 12b.

The storage section 12c is formed of one or more pieces of hardware for storing, for example, various data and programs, such as a hard disk drive (HDD) or other magnetic disk drive, a solid-state drive (SSD) or other semiconductor drive device, and a flash memory or other nonvolatile memory. The storage section 12c has a storage area that is used, for example, by the users of the servers 12.

The interface section 12d is a controller that controls the connection and communication with a host or client connected through a router (not depicted) and a network (not depicted) or the connection and communication with another server 12. The interface section 12d is also capable of controlling the connection and communication with the fans 21, shields 22, and servers 12 connected to the management server 13 through the control lines 1a, 1b and the communication line 1c. For example, a local area network (LAN), an interface card compliant with a fibre channel (FC) standard, or an interface card compliant, for example, with an inter-integrated circuit (I2C) protocol, which is used for the control of peripheral devices, may be used as the interface section 12d.

The input/output section 12e may include at least either one of an input device, such as a mouse and a keyboard, and an output device, such as a display and a printer. For example, the input/output section 12e is used when various operations are performed, for example, by a user or an administrator of the servers 12 (management server 13).

The recording medium 12f is a flash memory, a ROM, or other storage device that records various data and programs. The reader 12g is a device that reads data and programs recorded on a computer-readable recording medium 12h such as an optical disk or a universal serial bus (USB) memory.

At least either one of the recording media 12f, 12h may store a control program that implements the functions of the management server 13 according to the embodiment. In other words, the CPU 12a implements the functions of the management server 13 by deploying the control program, which is output from the recording medium 12f or from the recording medium 12h through the reader 12g, in the memory 12b or other storage device and executing it.

The above-mentioned pieces of hardware are interconnected through a bus so that they are able to communicate with each other. For example, the CPU 12a, the memory 12b, and the interface section 12d are connected to a system bus. Further, the storage section 12c, the input/output section 12e, the recording medium 12f, the reader 12g, and the like are connected to the system bus through an input/output (I/O) interface or the like. The storage section 12c is connected to a disk interface (DI) or other I/O interface through a storage bus (cable). A bus compliant with a small computer system interface (SCSI), a serial attached SCSI (SAS), the fibre channel standard, a serial advanced technology attachment (SATA) standard, or the like may be used as the storage bus.

The above-described hardware configuration of the servers 12 is an example. Therefore, the hardware configuration of the servers 12 may be changed as appropriate, for example, to increase or decrease the number of pieces of hardware or divide a certain piece of hardware. Further, the server 12 used as the management server 13 may differ in hardware configuration from the other servers 12. Besides, the configuration of an electronic device other than the servers 12 may be the same as at least part of the configuration depicted in FIG. 5.

[1-2-2] Functional Configuration of Management Server

Figure 6:
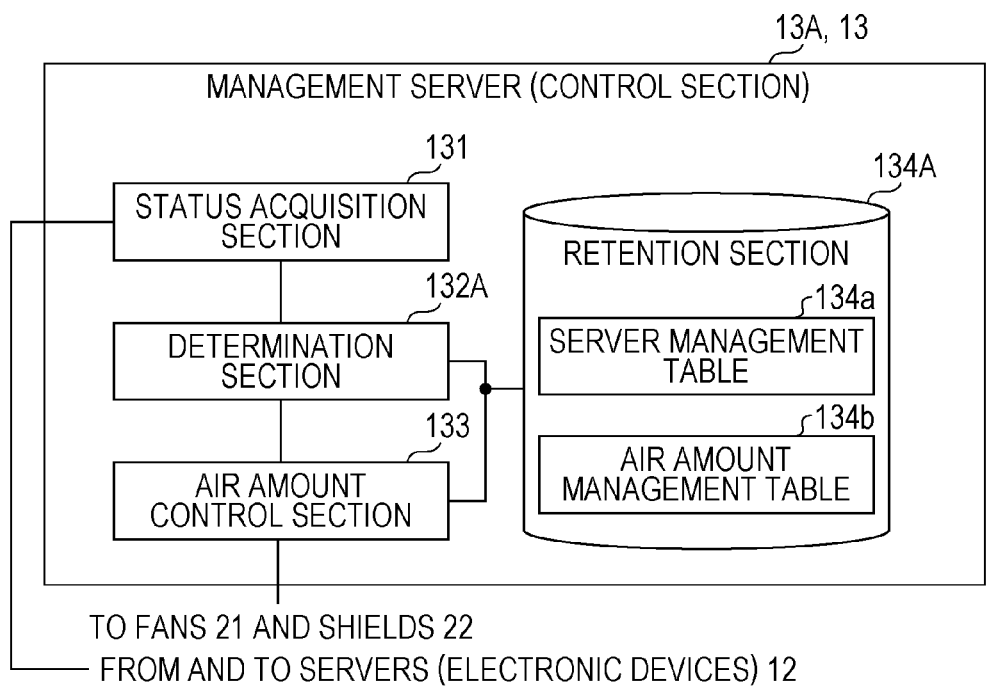
FIG. 6 is a diagram illustrating an exemplary functional configuration of a management server depicted in FIG. 1.

FIG. 6 is a diagram illustrating an exemplary functional configuration of the management server 13A depicted in FIG. 1. FIGS. 7 and 8 are diagrams illustrating an example of a server management table 134a and an example of an air amount management table 134b, which are both retained by the management server 13A depicted in FIG. 6.

The management server (control section) 13A according to the embodiment controls the fans 21 and the shields 22 in accordance with the status information including at least one of the internal temperature of the electronic devices (for example, the CPU (processor) temperature), the number of installed electronic devices, the scheme of electronic device installation, and the operating rate of the electronic devices (for example, the operating rate of the CPU (processor)).

The internal temperature of the electronic device may be the temperature of a hard disk drive or the like when a storage device is used as the electronic device, the temperature of a network adapter or the like when a communication device is used as the electronic device, or the temperature of a power supply circuit or the like when a power supply device is used as the electronic device. The operating rate of the electronic device may be the number of input/output operations per second (IOPS) or the like when a storage device is used as the electronic device, a band usage rate or the like when a communication device is used as the electronic device, or information indicative of a charge/discharge operation state when a power supply device is used as the electronic device.

For example, the management server 13A acquires the status information about the servers 12 (electronic devices) from the servers 12 or the like and controls the flow rates (air amounts) of air currents generated by the fans 21 in accordance with the acquired information. Further, the management server 13A locates a fan 21 whose air current has a flow rate lower than a predetermined value, selects one of the shields 22 that is related to the fan 21, and causes the selected shield 22 to shield the fan 21.

As depicted in FIG. 6, the management server 13A includes a status acquisition section 131, a determination section 132A, an air amount control section 133, and a retention section 134A.

The retention section 134A is a storage area that retains the server management table 134a depicted in FIG. 7. The retention section 134A is implemented, for example, by the aforementioned memory 12b. The retention section 134A may also retain the air amount management table 134b.

The server management table 134a is an example of relationship information that is used to manage the relationship between the mounting positions (installation positions) of the servers 12 (electronic devices) and the fans 21. For example, the management server 13A is able to identify a fan 21 related to a particular server 12 or identify a server 12 related to a particular fan 21 by managing the positional information indicative of the mounting (installation) positions of the servers 12 (electronic devices) in relation to the fans 21.

As depicted in FIG. 7, the server management table 134a includes information indicative of a mounting position in a rack 11, a server ID that is an example of identification information about a server 12 mounted at the mounting position, and a fan ID that is an example of identification information about a fan 21 related to the server 12.

As an example, the server ID "server39" and the related fan ID "fan06" are related to the rack mounting position "40". Further, the server ID "-" and the related fan IDs "fan 06, fan05" are related to the rack mounting position "38" at which no server 12 is mounted.

The rack mounting position is an example of positional information. In addition to the rack mounting position (number) depicted in FIG. 7, various other items of information, such as information about the distance from the lowest end (or the highest end) of the rack 11, may be used as the positional information. Further, if the container 10 includes a plurality of racks 11, the positional information may include information indicative of a particular rack 11. Furthermore, if the electronic devices in the container 10 are installed outside the racks 11, information indicative of a position within the container 10, which is predefined, for example, by a user of the servers 12 or by an administrator of the data center 1 or of the management server 13A, may be used as the positional information.

When a fan 21 is related to a server 12, it means that the cooling air supplied from the fan 21 mainly passes through the related server 12. When the intake end (front end) of a server 12 faces a fan 21 (opening 21a), the fan 21 related to the server 12 is a fan 21 that is positioned to substantially face the intake end (front end) of the server 12.

Further, when the container 10 includes an electronic device disposed outside the racks 11 and a fan 21 is positioned to substantially face the electronic device, the server management table 134a may include, for example, information indicative of the mounting position of the electronic device, the ID of the electronic device, and the ID of the related fan.

When adjusting the air amount of the cooling air for a server 12, the management server 13A may reference the server management table 134a to determine which fan 21 has to change its rotation speed.

When, for example, the data center 1 is built or the mounting of a server 12 on a rack 11 is changed, the server management table 134a is prepared or updated, for example, by a user of the server 12 or by an administrator of the data center 1 or of the management server 13A. Further, when a rack 11 or a server 12 is capable of detecting the mounting position of the server 12, the management server 13A may acquire the positional information from the rack 11 or the server 12 and prepare or update the server management table 134a in accordance with the positional relationship between the rack 11 and the fans 21.

In the example described above, the ID of a server 12 (electronic device) is used as the identification information about the server 12 (electronic device). However, the identification information is not limited to the ID of a server 12 (electronic device). The IP address or the serial number of the server 12 (electronic device), the media access control (MAC) address of the interface section 12d, or other unique information may be used as the identification information.

The air amount management table 134b is a list of information that is used to manage the rotation speeds (air amounts) of the fans 21 and the open/close status of the shields 22.

As depicted in FIG. 8, the air amount management table 134b includes the fan ID of a fan 21, the rotation speed (air amount) of the fan 21 in percentage, and the open/close status of a shield 22 related to the fan 21.

As an example, the rotation speed "90" percent and the shield open/close status "0" are related to the fan ID "fan00". In the example depicted in FIG. 8, the shield open/close status "0" indicates that the shield 22 is open, and the shield open/close status "1" indicates that the shield 22 is closed.

The management server 13A may reference the air amount management table 134b to recognize the controlled state of a fan 21 whose air amount is to be adjusted and the controlled state of a shield 22 related to the fan 21.

When the rotation speed of a fan 21 and/or the open/close status of a shield 22 are changed, the air amount management table 134b is prepared or updated by the air amount control section 133.

The status acquisition section 131 acquires the status information about each server 12 through the communication line 1c. The following description is given on the assumption that the status acquisition section 131 acquires the internal temperature (CPU temperature) of each server 12 as the status information.

For example, the status acquisition section 131 periodically transmits a CPU temperature acquisition request to each server 12. The status acquisition section 131 then receives an acquisition response, including a CPU temperature acquired, for example, by a predetermined application, from a server 12 to which the CPU temperature acquisition request was transmitted. Upon receipt of the acquisition response, the status acquisition section 131 associates a CPU temperature included in the acquisition response with the server 12 and notifies the determination section 132A of the CPU temperature associated with the server 12.

The status acquisition section 131 may acquire an operating rate (for example, a CPU load factor) from each server 12 instead of the CPU temperature or together with the CPU temperature.

In accordance with the server management table 134a and with the status information about each server 12 (CPU temperature), which is conveyed from the status acquisition section 131, the determination section 132A determines whether or not to have the air amount control section 133 control the fans 21 and/or the shields 22.

For example, the determination section 132A determines whether the CPU temperature reported from the status acquisition section 131 is higher than a first predetermined value and lower than a second predetermined value.

The first predetermined value is a reference value for increasing the amount of air to be supplied to the servers 12. When the status information conveyed from the status acquisition section 131 is a CPU temperature or a CPU operating rate, the first predetermined value is a threshold value for concluding that the CPU 12a is overheated. The second predetermined value is a reference value for decreasing the amount of air to be supplied to the servers 12. When the status information conveyed from the status acquisition section 131 is a CPU temperature or a CPU operating rate, the second predetermined value is a threshold value for concluding that the CPU 12a is supercooled.

If the CPU temperature is determined to be higher than the first predetermined value, the determination section 132A references the server management table 134a and locates one of the fans 21 that is related to a server 12 whose CPU temperature, which is included in the status information, is higher than the first predetermined value. The determination section 132A then instructs the air amount control section 133 to exercise control so as to increase the flow rate (air amount) of the air current to be generated from the located fan 21.

If, on the other hand, the CPU temperature is determined to be lower than the second predetermined value, the determination section 132A references the server management table 134a and locates one of the fans 21 that is related to a server 12 whose CPU temperature is lower than the second predetermined value. The determination section 132A then instructs the air amount control section 133 to exercise control so as to decrease the flow rate of the air current to be generated from the located fan 21.

In accordance with the instruction from the determination section 132A, the air amount control section 133 exercises control so as to increase or decrease the amount of air to be supplied from the located fan 21.

If, for example, a shield 22 related to the located fan 21 is closed when the determination section 132A instructs the air amount control section 133 to exercise control so as to increase the flow rate, the air amount control section 133 opens the shield 22 through the control line 1b. Further, the air amount control section 133 increases the rotation speed of the located fan 21 by a predetermined amount (for example, by 10% or 500 revolutions per minute (rpm)).

Meanwhile, when the determination section 132A instructs the air amount control section 133 to exercise control so as to decrease the flow rate, the air amount control section 133 decreases the rotation speed of the located fan 21 by a predetermined amount (for example, by 10% or 500 rpm) through the control line 1a. If the rotation speed of the located fan 21 decreases below a predetermined value due to control exercised to decrease the flow rate (if, for example, the rotation speed is reduced to 0 (zero) to stop the fan 21), the air amount control section 133 closes the shield 22 through the control line 1b.

At least either one of the above-mentioned control for increasing the flow rate and the above-mentioned control for decreasing the flow rate may be exercised only once by the air amount control section 133 when the associated instruction is received from the determination section 132A. Further, the air amount control section 133 may exercise control to increase or decrease the flow rate in accordance with an instruction received from the determination section 132A in a stepwise manner until the CPU temperature is not higher than the first predetermined value or not lower than the second predetermined value. In this instance, it is desirable that each time the air amount control section 133 exercises control to increase or decrease the flow rate of a target fan 21, the status acquisition section 131 and the determination section 132A acquire the status information about the fan 21 and determine the necessity of controlling the amount of air supplied from the fan 21.

Alternatively, if a server 12 whose CPU temperature is higher than the first predetermined value is recognized, the determination section 132A may determine whether any of the fans 21 is stopped. If any fan 21 is stopped, the air amount control section 133 opens the shield 22 for the stopped fan 21 and operates the stopped fan 21. If the CPU temperature is still higher than the first predetermined value, the air amount control section 133 may increase the rotation speed of the fan 21 or the rotation speed of a fan 21 related to a server 12 whose CPU temperature is higher than the first predetermined value.

If the CPU temperature is still lower than the second predetermined value after control is exercised to decrease the air amount, the determination section 132A may instruct the air amount control section 133 to stop some of the fans 21 and close the shields 22 for the stopped fans 21.

As described above, upon receipt of a signal (acquisition response concerning the status information) indicative of supercooling from a server 12, the management server 13A decreases the rotation speed of the related fan 21. When the rotation speed of the fan 21 is decreased until it is not higher than the predetermined value, the management server 13A causes the related shield 22 to shield the fan 21 (close the opening 21a in the container 10).

This permits the management server 13A according to the embodiment to reduce the amount of extra electricity by stopping a fan 21 that causes a server 12 or other electronic device to be supercooled. In addition, as depicted in FIG. 2, it is possible to inhibit operating fans 21 from causing the air to flow backward to the opening 21a for a stopped fan 21. Consequently, the cooling capabilities of the operating fans 21 may be fully utilized.

In accordance with the status information about each server 12, which is conveyed from the status acquisition section 131, and with the server management table 134a, the determination section 132A is able to detect a situation where no server 12 is mounted in a certain region of a rack 11 or servers 12 mounted in a certain region of the rack 11 are not operating. If such a situation is detected, the determination section 132A may, in accordance with the server management table 134a, acquire a fan ID related to a rack mounting position at which no server 12 is mounted or operated. Subsequently, the determination section 132A may instruct the air amount control section 133 to decrease the amount of air to be supplied from a fan 21 having the acquired fan ID.

The above permits the management server 13A to control the fans 21 and the shields 22 in such a manner as to supply the minimum amount of cooling air to operating servers 12 and minimize the amount of cooling air to be supplied to a blank region where no server 12 is mounted or to a region where the servers 12 are turned off. This makes it possible to enhance the efficiency of reducing the amount of electrical power consumption.

Although FIG. 2 illustrates a case where the lowest one of the fans 21 is stopped, the embodiment is not limited to such a case. For example, central or upper fans 21 may be stopped instead of the lowest fan 21 depending on the operating rates of the servers 12 and the mounting of the servers 12 on the rack 11. In other words, the management server 13A is capable of controlling the fans 21 and the shields 22 in such a manner as to properly distribute the cooling air by supplying an adequate amount of cooling air to operating servers 12 and minimizing the amount of cooling air to be supplied to lightly-loaded or non-operating servers 12 or to the blank region.

Alternatively, the management server 13A may operate only some of the fans 21 depending on the status of each server 12 in order to comprehensively reduce the amount of cooling air to be supplied from the air conditioner 20.

The management server 13A may also perform the above-described control process in relation to electronic devices installed outside the rack 11 and to the fans 21 and shields 22 for such electronic devices.

As described above, the management server 13A according to the embodiment is capable of efficiently cooling electronic devices in the data center 1 in which the electronic devices are installed.

The results of calculations performed by using a simulation model are now described with reference to FIGS. 9 to 11.

Figure 9:
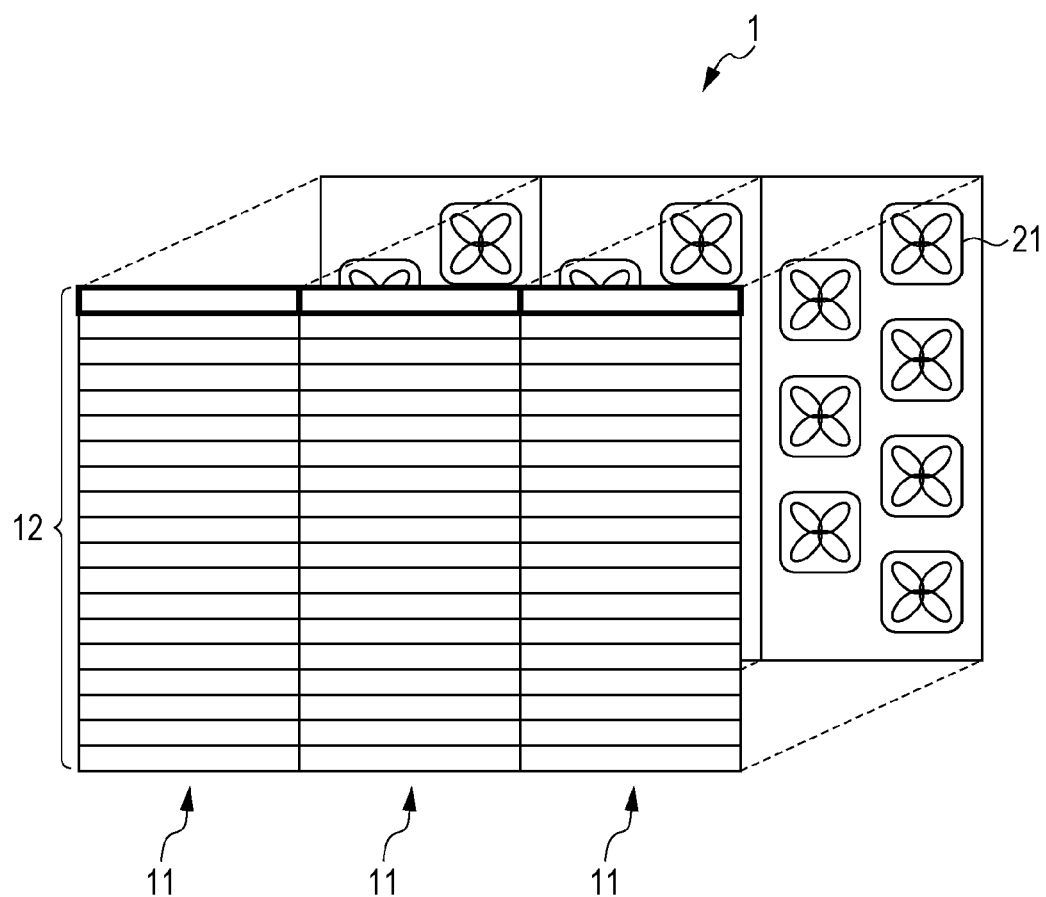
FIG. 9 is a diagram illustrating a simulation model that describes an opening shielding effect produced by the shields depicted in FIG. 1.

FIG. 9 is a diagram illustrating the simulation model that describes the effect of shielding the openings 21a by the shields 22 depicted in FIG. 1. FIG. 10 is a diagram illustrating a wind speed distribution to the servers 12 that is calculated from the simulation model depicted in FIG. 9. FIG. 11 is a diagram illustrating the distribution of exhaust temperatures of the servers 12 that is calculated from the simulation model depicted in FIG. 9.

For the sake of brevity, FIG. 9 does not depict an outer wall of the container 10, the air conditioner 20, the shields 22, or the depth of the servers 12 (racks 11).

The simulation model depicted in FIG. 9 is based on a container-type data center 1 that matches conditions (i) to (iv) below:

(i) Three racks 11 on which forty rack-mount servers are mounted are used (a total of 120 servers 12 are used).

(ii) Three air conditioners 20 are used (each air conditioner 20 is positioned to face a rack 11).

(iii) The cold aisle and the hot aisle are partitioned from each other by a wall.

(iv) Seven fans 21 are used for each air conditioner 20.

Figure 10:
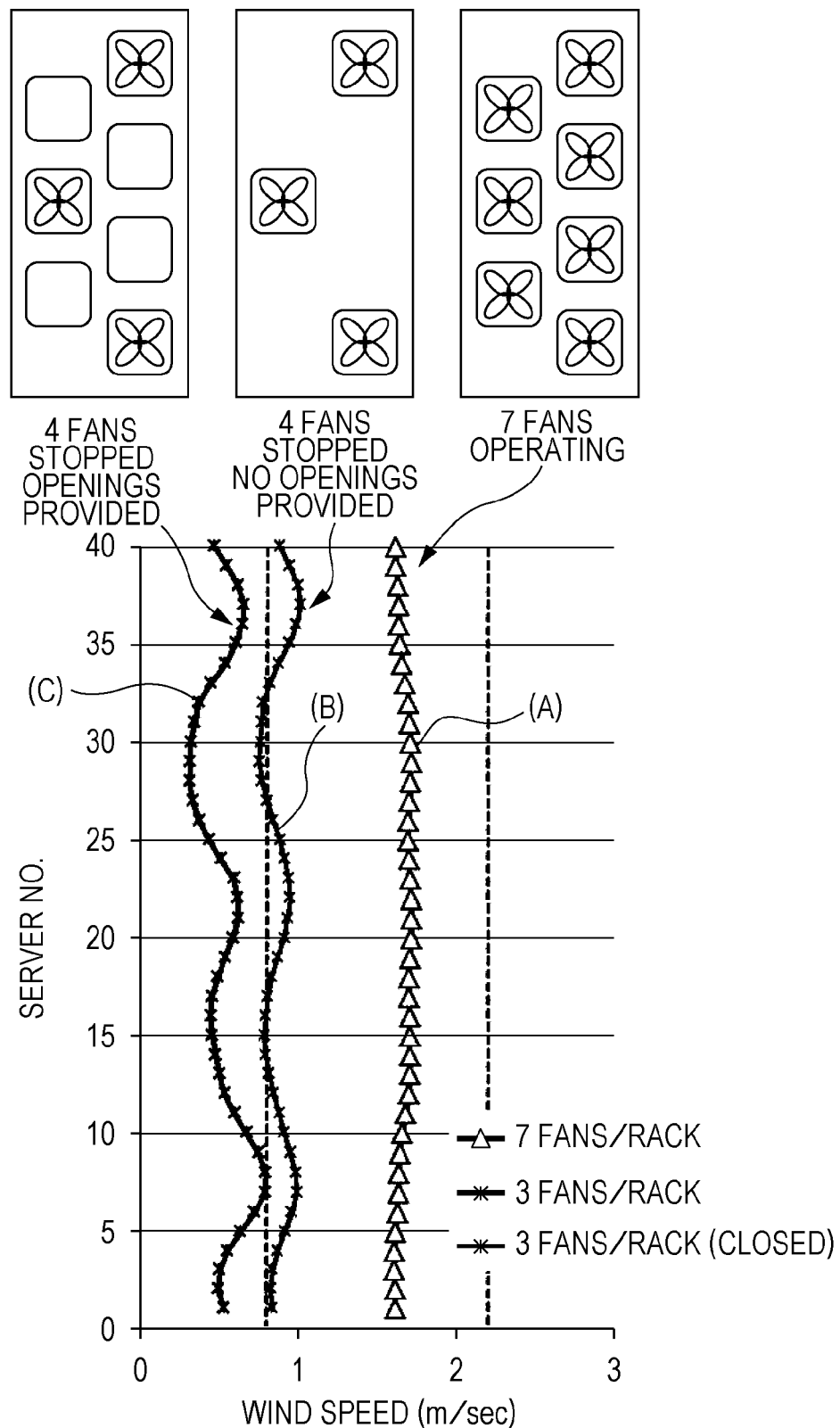
FIG. 10 is a diagram illustrating a wind speed distribution to servers that is calculated from the simulation model depicted in FIG. 9.
Figure 11:
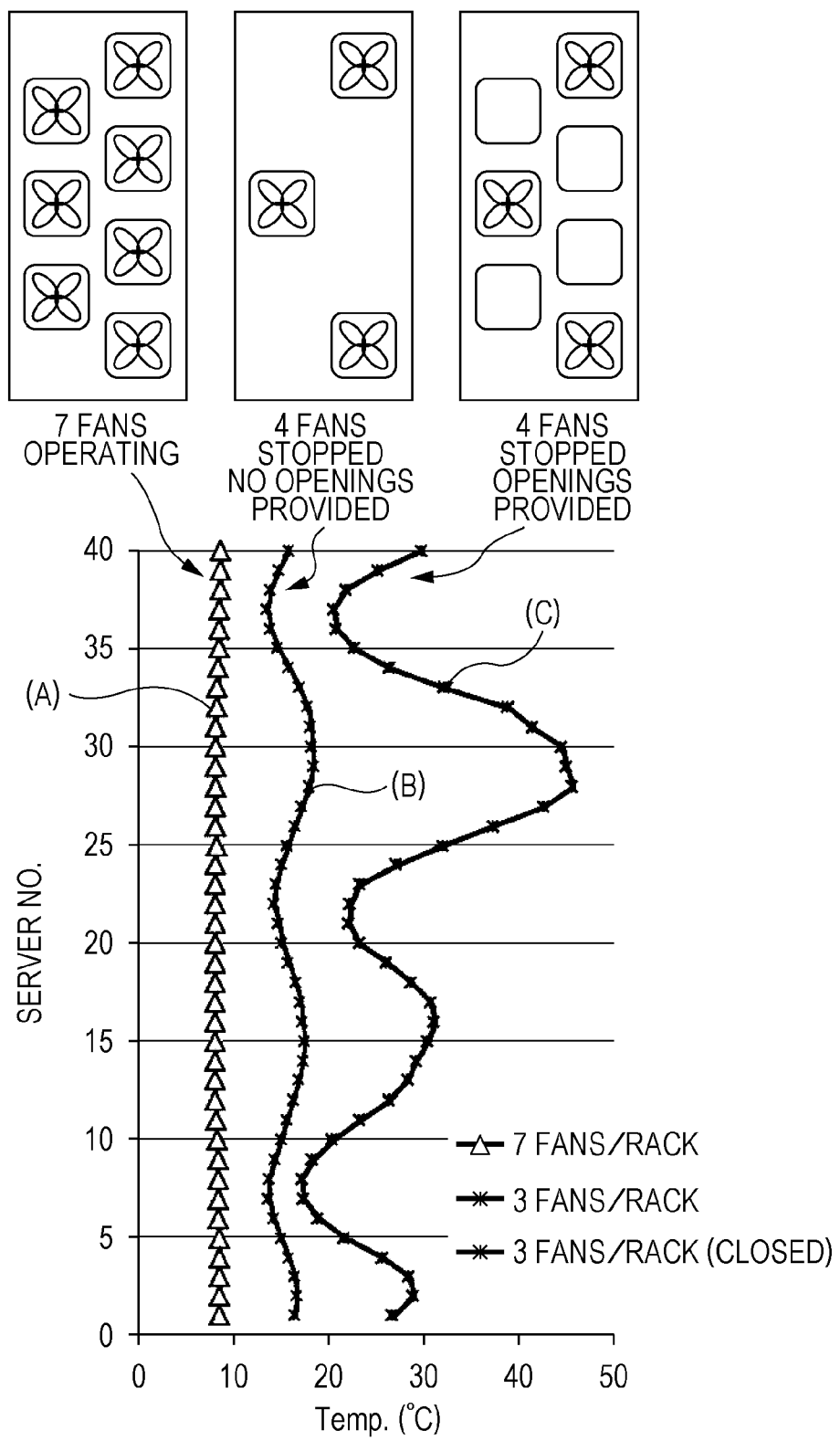
FIG. 11 is a diagram illustrating the distribution of exhaust temperatures of the servers that is calculated from the simulation model depicted in FIG. 9.

On the assumption that the above conditions are met, calculations are performed under three conditions, namely conditions (a), (b), and (c) below, to obtain the wind speed distribution to the servers 12 and the exhaust temperature distribution of the servers 12 as depicted in FIGS. 10 and 11.

(a) When seven fans 21 are operated for each rack 11

(b) When four fans 21 for each rack 11 are stopped with the openings 21a for the stopped fans 21 shielded by the shields 22 (no openings are provided)

(c) When four fans 21 for each rack 11 are stopped with the openings 21a for the stopped fans 21 left unshielded by the shields 22 (openings are provided)

Under condition (a), the results of calculations, which are depicted at (A) in FIGS. 10 and 11, indicate that the speeds of wind taken in by the individual servers 12 have a narrow distribution and exhibit an average of approximately 1.5 m/sec, and that the exhaust temperatures of the individual servers 12 also have a narrow distribution and exhibit an average of approximately 9° C.

Under condition (b), the results of calculations, which are depicted at (B) in FIGS. 10 and 11, indicate that the speeds of wind taken in by the individual servers 12 have a certain distribution and exhibit an average of approximately 0.9 m/sec, and that the exhaust temperatures of the individual servers 12 also have a certain distribution and exhibit an average of approximately 16° C.

Under condition (c), the results of calculations, which are depicted at (C) in FIGS. 10 and 11, indicate that the speeds of wind taken in by the individual servers 12 have a wide distribution and exhibit an average of approximately 0.6 m/sec, and that the exhaust temperatures of the individual servers 12 also have a wide distribution and exhibit an average of approximately 28° C. Although not depicted in FIGS. 10 and 11, the cooling air flows backward under condition (c) from the operating fans 21 through the openings 21a for the stopped fans 21.

As described above, it is obvious that when the openings 21a for the stopped fans 21 are not shielded, the speeds of wind taken in by the individual servers 12 and the exhaust temperatures of the individual servers 12 both have a wider distribution than when the openings 21a are shielded. It is also obvious that the wind speeds and the exhaust temperatures are both decreased when the openings 21a for the stopped fans 21 are not shielded.

As described above, the management server 13A according to the embodiment uses the shields 22 to shield stopped fans 21 (openings 21a). This inhibits the cooling air from flowing backward to the openings 21a for the stopped fans 21 and causes the cooling air to flow to all servers 12. Hence, the exhaust temperature distribution of all the servers 12 may be narrowed. This makes it possible to narrow the distribution of CPU temperatures of the individual servers 12 as well.

It is obvious, as described above, that shielding fans 21 (openings 21a) is effective when the amount of electrical power consumption is to be reduced by stopping the fans 21.

[1-3] Exemplary Operation

Figure 12:
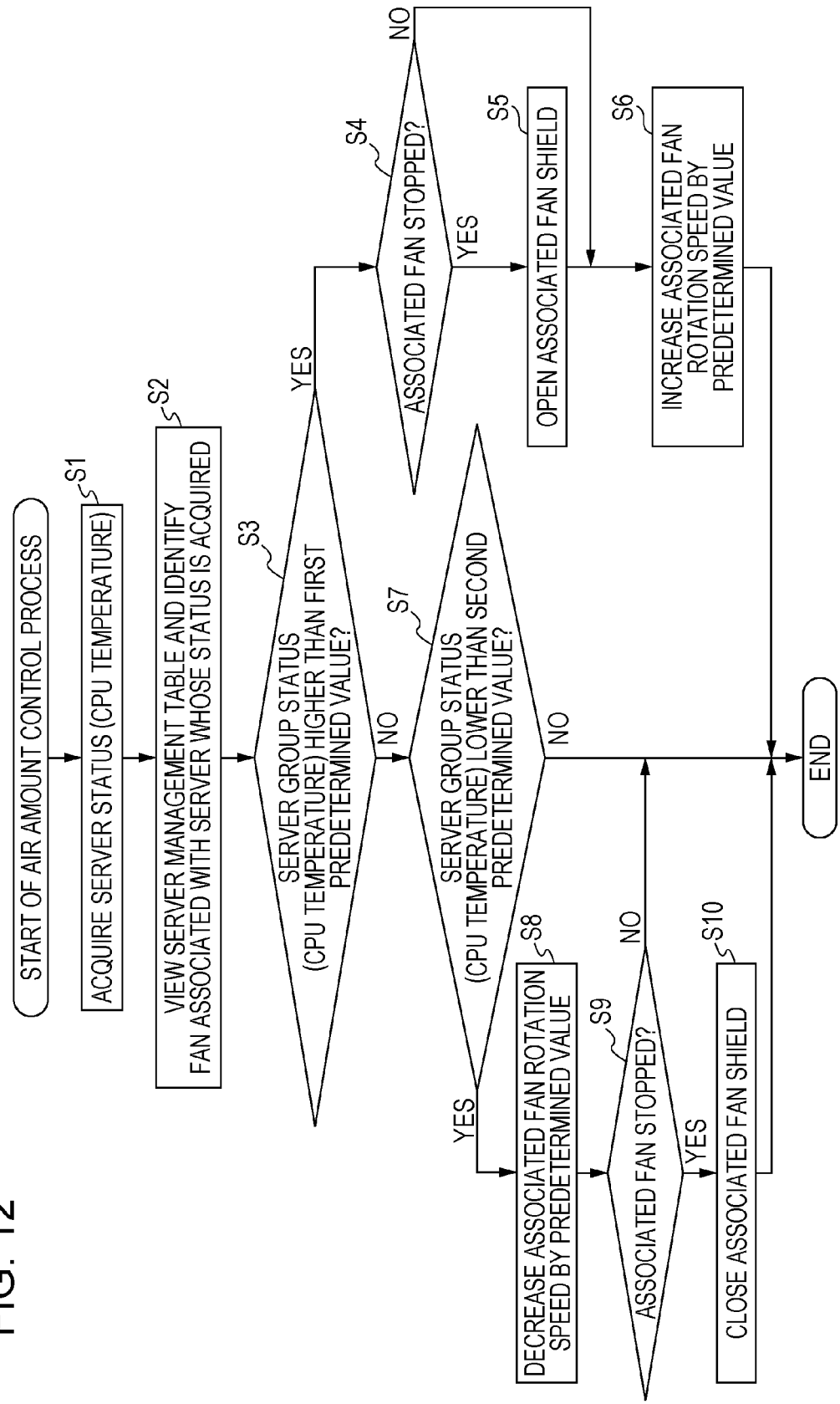
FIG. 12 is a flowchart illustrating an example of an air amount control process for an air conditioner installed at the container-type data center depicted in FIG. 1.

An air amount control process for the air conditioner 20 at the data center 1, which is an example of the embodiment configured as described above, is now described with reference to FIG. 12. FIG. 12 is a flowchart illustrating an example of the air amount control process for the air conditioner 20 at the data center 1 depicted in FIG. 1.

As depicted in FIG. 12, the status acquisition section 131 acquires the status information about a server 12 (for example, the CPU temperature) through the communication line is (operation S1). The acquired status information and the ID of the server are conveyed to the determination section 132A.

The determination section 132A references the server management table 134a, acquires a fan ID related to the server ID conveyed from the status acquisition section 131, and locates a fan 21 related to the server ID as a control target fan 21 (operation S2).

Further, the determination section 132A determines whether the conveyed status information (CPU temperature) is higher than the first predetermined value (operation S3). If the conveyed status information (CPU temperature) is higher than the first predetermined value (if the query in operation S3 is answered "YES"), the determination section 132A instructs the air amount control section 133 to exercise control in such a manner as to increase the amount of air supplied from the located fan 21.

The air amount control section 133 determines whether the control target fan 21, which is located by the determination section 132A, is stopped (operation S4). If the control target fan 21 is not stopped (if the query in operation S4 is answered "NO"), processing proceeds to operation S6. If the air amount management table 134b is retained by the retention section 134A, the air amount control section 133 references the air amount management table 134b in operation S4 to determine whether the control target fan 21 is stopped.

If, on the other hand, the control target fan 21 is stopped (if the query in operation S4 is answered "YES"), the air amount control section 133 controls the shield 22 related to the control target fan 21 through the control line 1b in such a manner as to open the opening 21a for the control target fan 21 (operation S5).

Next, the air amount control section 133 controls the control target fan 21 through the control line is in such a manner as to increase the rotation speed of the control target fan 21 by a predetermined amount (operation S6). Upon completion of operation S6, processing comes to an end.

If, on the other hand, the status information (CPU temperature) is determined in operation S3 to be not higher than the first predetermined value (if the query in operation S3 is answered "NO"), the determination section 132A determines whether the status information is lower than the second predetermined value (operation S7).

If the status information is lower than the second predetermined value (if the query in operation S7 is answered "YES"), the determination section 132A instructs the air amount control section 133 to exercise control in such a manner as to decrease the amount of air supplied from the located control target fan 21.

The air amount control section 133 controls the control target fan 21 located by the determination section 132A through the control line is in such a manner as to decrease the rotation speed of the control target fan 21 by a predetermined amount (operation S8). Further, the air amount control section 133 determines whether the control target fan 21 is stopped (operation S9). If the control target fan 21 is stopped (if the query in operation S9 is answered "YES"), the air amount control section 133 controls the shield 22 related to the control target fan 21 through the control line 1b in such a manner as to close the opening 21a for the control target fan 21 (operation S10). Upon completion of operation S10, processing comes to an end.

If, in operation S7, the determination section 132A determines that the conveyed status information (CPU temperature) is not lower than the second predetermined value (if the query in operation S7 is answered "NO"), processing comes to an end. Further, if, in operation S9, the air amount control section 133 determines that the control target fan 21 is not stopped (if the query in operation S9 is answered "NO"), processing also comes to an end.

As described above, the air amount control process for the air conditioner 20 at the data center 1 according to the embodiment is brought to an end.

The management server 13A is able to perform the air amount control process depicted in FIG. 12 for the individual servers 12 each time it acquires the status information from the individual servers 12.

Referring to FIG. 12, the determination in operation S3 (the processing operations performed in operations S3 to S6) may be interchanged with the determination in operation S7 (the processing operations performed in operations S7 to S10).

Moreover, the processing operation to be performed in operation S4 may be omitted. If such an omission is made, it is appropriate that the air amount control section 133 control the shield 22 related to the control target fan 21 so as to open its opening 21a whenever control is exercised to increase the flow rate.

[2] First Modification

A first modification, which is an exemplary modification of the above-described embodiment, is now described.

The virtualization technology, which permits a plurality of servers to execute a virtual machine (VM), reduces the overall electrical power consumption of the servers by shifting a load to some specific servers and idling or stopping unloaded servers.

The following description is given on the assumption that each of a plurality of servers 12 according to the first modification executes the above-mentioned VM.

Figures 13, 14:
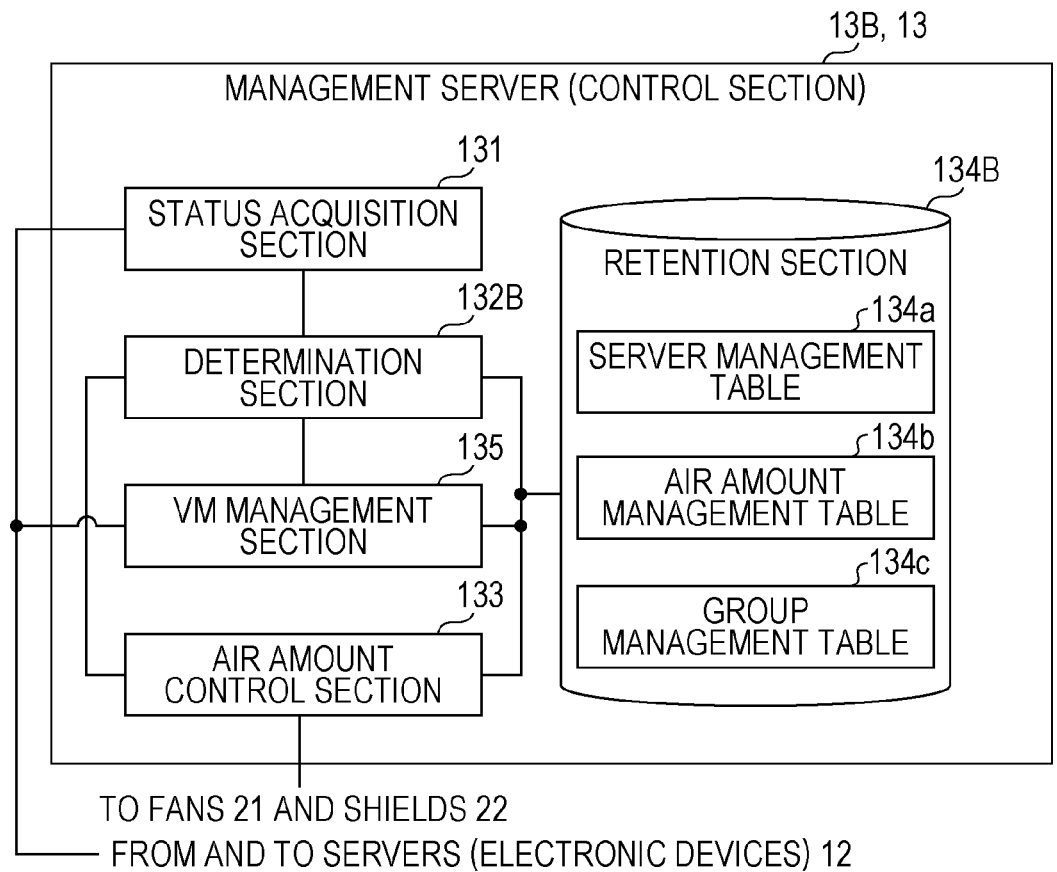
FIG. 13 is a diagram illustrating a first modification of the functional configuration of the management server depicted in FIG. 6.
FIG. 14 is a diagram illustrating an example of a group management table retained by the management server depicted in FIG. 13.
Figure 15:
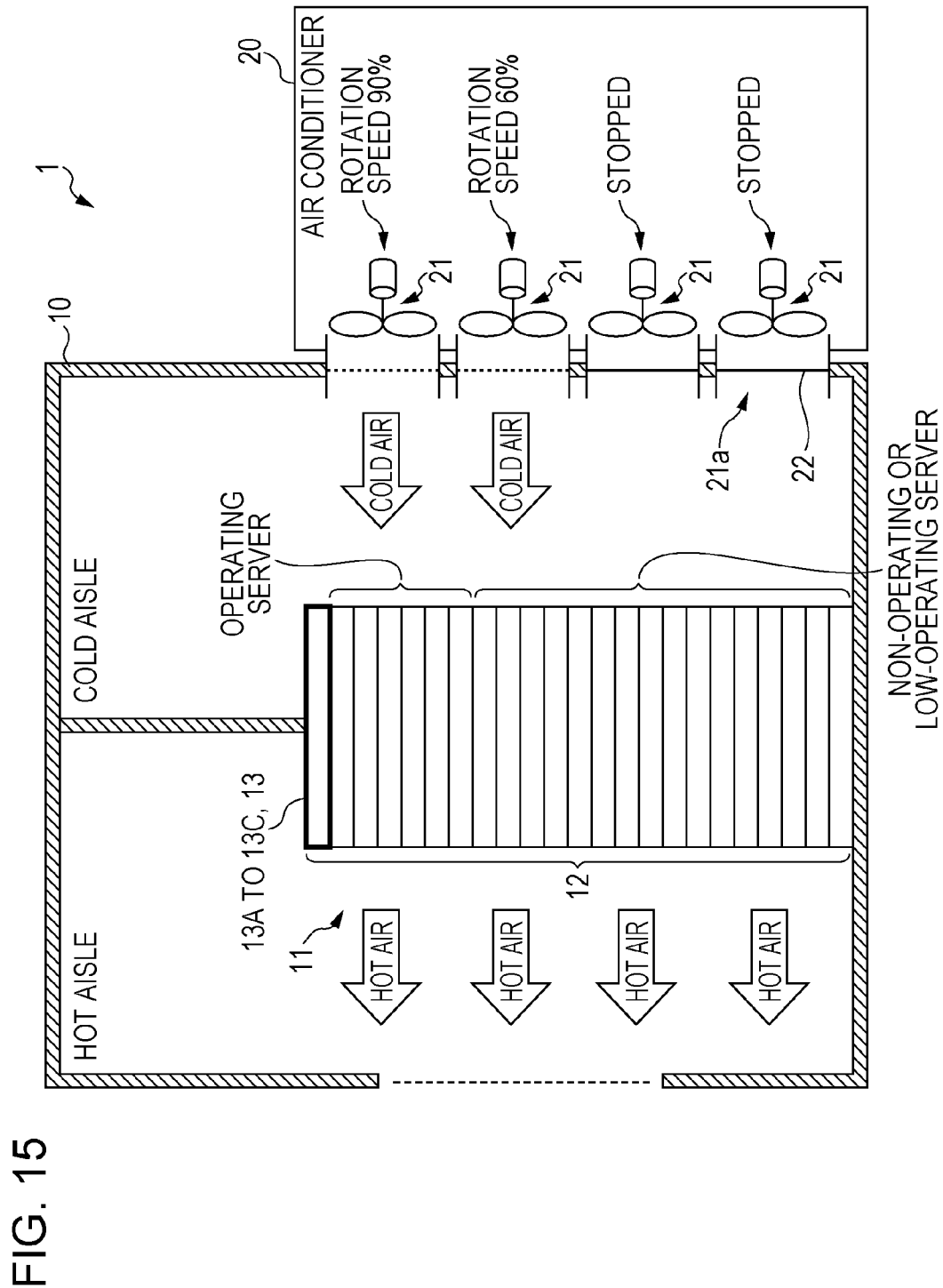
FIG. 15 is a diagram illustrating how the cooling air flows when the servers depicted in FIG. 1 are unevenly loaded and some fans are stopped with their shields closed.

FIG. 13 is a diagram illustrating the first modification of the functional configuration of the management server 13A depicted in FIG. 6. FIG. 14 is a diagram illustrating an example of a group management table 134c retained by the management server 13B depicted in FIG. 13. FIG. 15 is a diagram illustrating how the cooling air flows when the servers 12 depicted in FIG. 1 are unevenly loaded and some fans 21 are stopped with their shields 22 closed.

As depicted in FIG. 13, the management server (control section) 13B according to the first modification includes a VM management section 135 in addition to the functions of the management server 13A depicted in FIG. 6. Further, the management server 13B includes a determination section 132B, which executes processing functions according to the first modification, in addition to the determination section 132A depicted in FIG. 6. Furthermore, a retention section 134B additionally includes the group management table 134c.

Referring to FIG. 13, reference characters identical with those in FIG. 6 denote elements identical with or similar to those depicted in FIG. 6. Such elements are not redundantly described.

First of all, the group management table 134c is described.

The group management table 134c is a list of information that is used to manage a plurality of fans 21 by dividing them into a plurality of groups (for example, three groups).

As depicted in FIG. 14, the group management table 134c includes information about a group ID, a fan ID, and a rack mounting position. The group ID is the ID of a group. The fan ID is the ID of a fan that belongs to the group. The rack mounting position is a mounting position of a rack 11 that is related to the fan 21.

As an example, the fan IDs "fan00, fan01" and the rack mounting positions "40, 39, . . . , 26" are related to the group ID "group00".

When, for example, the data center 1 is built, the group management table 134c is prepared or updated, for example, by an administrator of the data center 1 or of the management server 13B.

Alternatively, the group management table 134c may be omitted by providing the server management table 134a with a "group ID" field.

The VM management section 135 has a load shift function that is executed to shift a VM executed by a server 12 to another server 12.

More specifically, the VM management section 135 exercises control through the communication line 1c so that a load on a plurality of servers 12 is centralized on servers 12 in a particular region (servers mounted within a specific range of rack mounting positions). This permits the management server 13B to exercise control in such a manner as to increase or decrease the amount of air supplied from the fans 21 for the purpose of supplying the minimum amount of cooling air adequate for the imposed load to highly-loaded servers 12 to which many VMs are shifted. The management server 13B is also permitted to exercise control in such a manner as to increase or decrease the amount of air supplied from the fans 21 for the purpose of supplying the minimum amount of cooling air adequate for an operating state to lightly-loaded servers that are idling or stopped.

The above-mentioned control for increasing or decreasing the amount of supplied air is exercised by the status acquisition section 131, the determination section 132B, and the air amount control section 133, as is the case with the management server 13A depicted in FIG. 6.

For example, the management server 13B extraordinarily shifts the load on the servers 12 to upper servers and operates fans 21 facing an upper region in which highly-loaded servers 12 (for example, servers 12 whose CPU temperature or operating rate is high) are operating, as depicted in FIG. 15. Further, the management server 13B stops fans 21 facing a region in which servers 12 are lightly loaded or not loaded at all, and causes the related shields 22 to shield the openings 21a for the stopped fans 21.

As described above, the management server 13B according to the first modification is capable of producing the same advantageous effects as the embodiment.

Further, the management server 13B is capable of efficiently controlling the operating rates of a plurality of fans 21 by centralizing the load on particular servers 12. This makes it possible to supply the minimum amount of cooling air to highly-loaded servers 12.

Furthermore, in accordance with the server management table 134a and the group management table 134c, the VM management section 135 is capable of selecting servers on which the load is to be centralized.

For example, the VM management section 135 is able to select servers 12 (electronic devices) related to fans 21 in a particular one of the groups in accordance with the above-mentioned tables 134a, 134c, and cause the selected servers 12 to perform processes that are to be performed initially by a larger number of servers 12 (electronic devices).

As an example, the VM management section 135 is able to centralize the load on servers 12 having the server IDs "server39, server38, . . . " (see FIG. 7), which are mounted in the rack mounting positions "40, 39, . . . , 26" (see FIG. 14) related to the group ID "group00".

When the load is shifted by the VM management section 135 in accordance with the group management table 134c, the determination section 132B switches the control of the flow rate of the air current generated by each of the fans 21 from a fan-specific control mode to a group-specific control mode. In other words, the determination section 132B controls the flow rate of the air current generated by each of the fans 21 on an individual group basis in accordance with the status information about the electronic devices and with the server management table 134a (relationship information).

For example, the determination section 132B receives the status information about each server 12 from the status acquisition section 131 and performs a determination process on an individual group basis. More specifically, the determination section 132B determines whether or not the status information (for example, the average, minimum, or maximum CPU temperature) about one or more servers 12 related to a group of fans 21 is higher than the first predetermined value and lower than the second predetermined value. When it is determined that the status information about the one or more servers 12 is higher than the first predetermined value or lower than the second predetermined value, the determination section 132B instructs the air amount control section 133 to exercise control in such a manner as to increase or decrease the flow rate of the air current to be generated from all the fans 21 in the related group.

More specifically, the determination section 132B increases the flow rate of the air current generated from the fans 21 in a predetermined group and decreases, on an individual group basis, the flow rate of the air current generated from the fans 21 in a group other than the predetermined group. In this instance, the amount of flow rate decrease increases with an increase in the distance from the predetermined group. Further, if the flow rate of the air current generated from each of the other groups is not higher than a predetermined value, the determination section 132B selects shields 22 related to the fans 21 in the other groups and causes the selected shields 22 to shield the fans 21 in the other groups.

As described above, the management server 13B according to the first modification sets, for example, the highest rotation speed for fans 21 in a first group, which is in a region nearest to a group of highly-loaded servers, and stops fans 21 in a third group, which is in a region farthest from the group of highly-loaded servers, and shields the openings 21a for the stopped fans 21. Further, the rotation speed of fans 21 in a second group, which is sandwiched between the first and third groups, may be set to be lower than the rotation speed of the fans 21 in the first group.

Consequently, the management server 13B is able to change the rotation speed of fans 21 in a particular group or stop the fans 21 therein, supply the minimum amount of cooling air to operating servers 12, and inhibit the cooling air from being supplied to the other servers 12. This makes it possible to enhance the efficiency of reducing the amount of electrical power consumption.

The above-described control exercised by the management server 13B may be similarly exercised over electronic devices installed outside a rack 11 and over the fans 21 and shields 22 related to such electronic devices.

Figure 16:
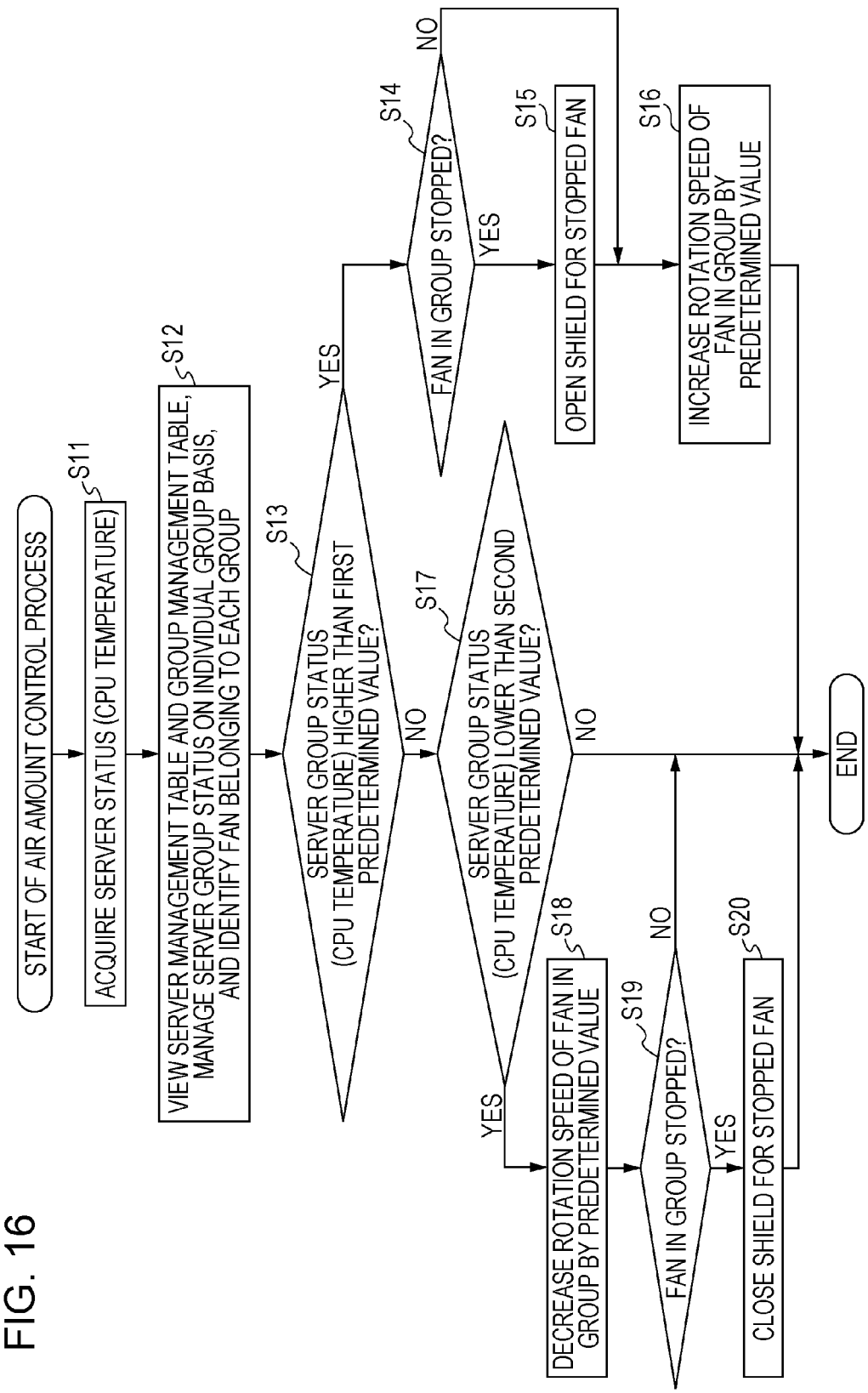
FIG. 16 is a flowchart illustrating the first modification of the air amount control process of the air conditioner installed at the container-type data center depicted in FIG. 1.

The air amount control process for the air conditioner 20 at the data center 1 according to the first modification, which is configured as described above, is now described with reference to FIG. 16. FIG. 16 is a flowchart illustrating the first modification of the air amount control process for the air conditioner 20 at the data center 1 depicted in FIG. 1.

As depicted in FIG. 16, the status acquisition section 131 acquires the status information about servers 12 (for example, the CPU temperature) through the communication line is (operation S11). The acquired status information and the IDs of the servers 12 are conveyed to the determination section 132B.

The determination section 132B references the server management table 134a and the group management table 134c and manages the conveyed status information about each server 12 for each server group related to a group of fans 21. Further, the determination section 132B locates the fans 21 in each group (operation S12).

Furthermore, the determination section 132B determines whether the status information about a server group (for example, the average CPU temperature) is higher than the first predetermined value (operation S13). If the status information about the server group is higher than the first predetermined value (if the query in operation S13 is answered "YES"), the determination section 132B instructs the air amount control section 133 to exercise control in such a manner as to increase the amount of air supplied from the grouped fans 21 that are located in operation S12 and related to the server group.

The air amount control section 133 determines whether the grouped fans 21 designated by the determination section 132B are stopped (operation S14). If the grouped fans 21 are not stopped (if the query in operation S14 is answered "NO"), processing proceeds to operation S16.

If, on the other hand, the grouped fans 21 are stopped (if the query in operation S14 is answered "YES"), the air amount control section 133 exercises control through the control line 1b to let the shields 22 related to the stopped fans 21 open the openings 21a for the stopped fans 21 (operation S15).

Next, the air amount control section 133 controls the grouped fans 21 through the control line 1a to increase the rotation speed of the fans 21 by a predetermined amount (operation S16). Upon completion of operation S16, processing comes to an end.

If, on the other hand, the status information about the server group is not higher than the first predetermined value (if the query in operation S13 is answered "NO"), the determination section 132B determines whether the status information about the server group is lower than the second predetermined value (operation S17).

If the status information is lower than the second predetermined value (if the query in operation S17 is answered "YES"), the determination section 132B instructs the air amount control section 133 to exercise control in such a manner as to decrease the amount of air supplied from the grouped fans 21 that are located in operation S12 and related to the server group.

The air amount control section 133 exercises control through the control line 1a to decrease the rotation speed of the grouped fans 21 designated by the determination section 132B by a predetermined amount (operation S18). Further, the air amount control section 133 determines whether the grouped fans 21 are stopped (operation S19). If the grouped fans 21 are stopped (if the query in operation S19 is answered "YES"), the air amount control section 133 exercises control through the control line 1b to let the shields 22 related to the stopped fans 21 close the openings 21a for the stopped fans 21 (operation S20). Upon completion of operation S20, processing comes to an end.

If, in operation S17, the determination section 132B determines that the status information about the server group is not lower than the second predetermined value (if the query in operation S17 is answered "NO"), processing comes to an end. Further, if, in operation S19, the air amount control section 133 determines that the grouped fans 21 are not stopped (if the query in operation S19 is answered "NO"), processing also comes to an end.

As described above, the air amount control process for the air conditioner 20 at the data center 1 according to the first modification is brought to an end.

The management server 13B is able to perform the air amount control process depicted in FIG. 16 each time it acquires the status information from the individual servers 12.

Referring to FIG. 16, the determination in operation S13 (the processing operations performed in operations S13 to S16) may be interchanged with the determination in operation S17 (the processing operations performed in operations S17 to S20).

Furthermore, the processing operation to be performed in operation S14 may be omitted. If such an omission is made, it is appropriate that the air amount control section 133 control the shields 22 related to the grouped fans 21 so as to open the grouped fans 21 (their openings 21a) whenever control is exercised to increase the flow rate.

Moreover, the VM management section 135 may extraordinarily shift the VMs to a particular server group before operation S11.

[3] Second Modification

A second modification, which is an exemplary modification of the embodiment, is now described.

Figure 17:
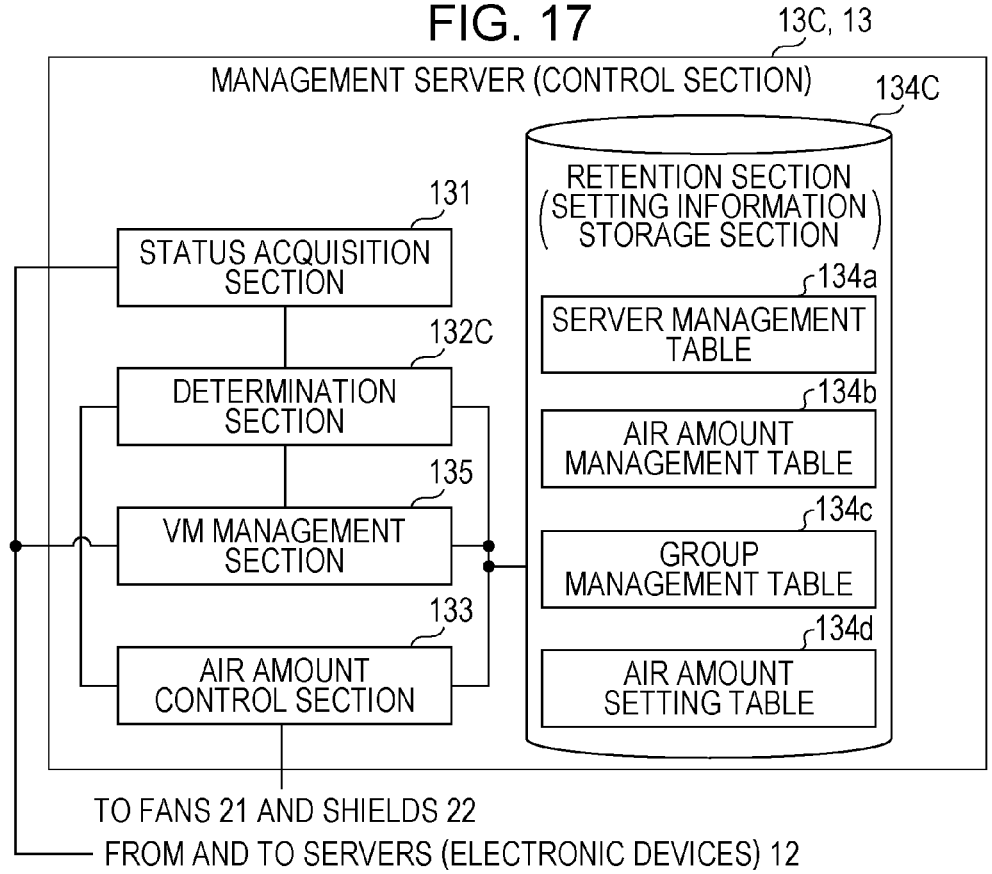
FIG. 17 is a diagram illustrating a second modification of the functional configuration of the management server depicted in FIG. 6.
Figure 18:
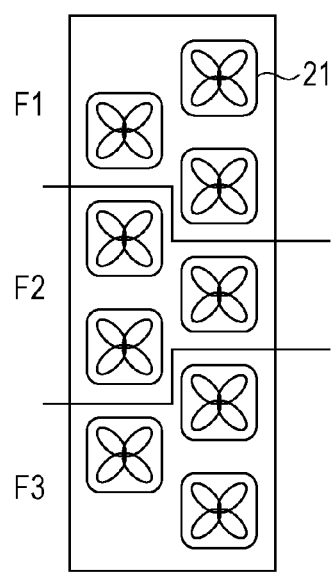
FIG. 18 is a diagram illustrating groups to which the fans according to the second modification belong.
Figures 19, 20:
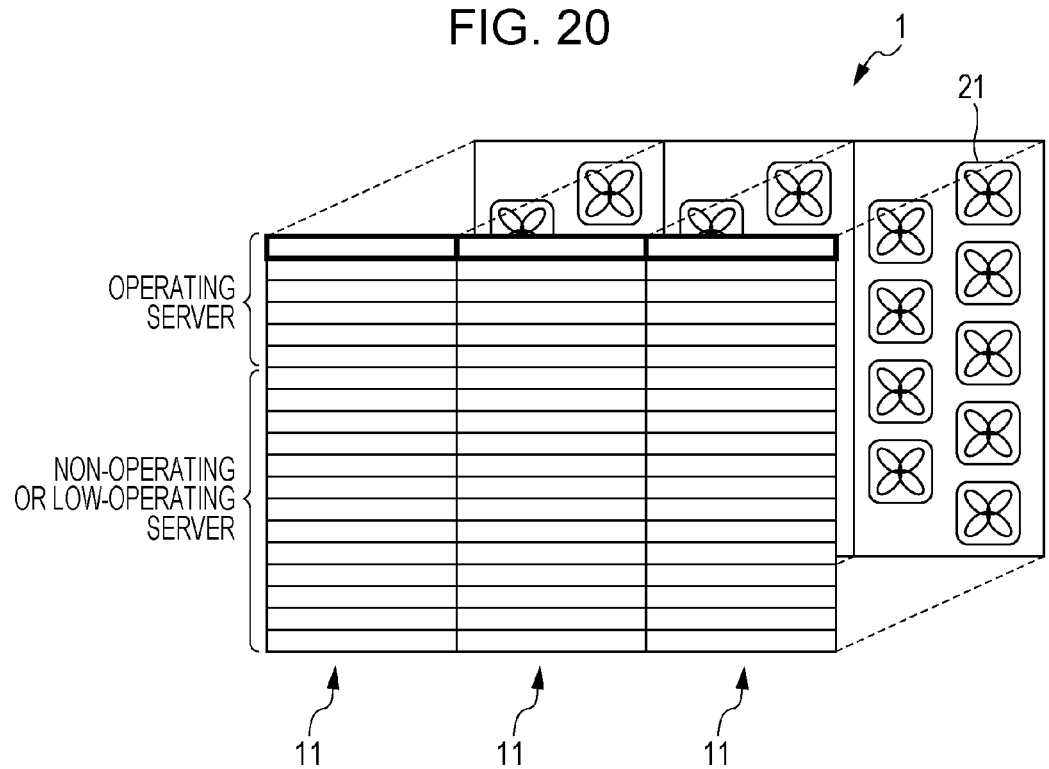
FIG. 19 is a diagram illustrating an example of an air amount setting table retained by the management server depicted in FIG. 17.
FIG. 20 is a diagram illustrating a simulation model that is used to calculate a combination of settings in the air amount setting table depicted in FIG. 19.

FIG. 17 is a diagram illustrating the second modification of the functional configuration of the management server 13A depicted in FIG. 6. FIG. 18 is a diagram illustrating groups to which the fans 21 according to the second modification belong. FIG. 19 is a diagram illustrating an example of an air amount setting table 134d retained by the management server 13C depicted in FIG. 17.

As depicted in FIG. 17, the management server (control section) 13C according to the second modification has substantially the same configuration as the functions of the management server 13B depicted in FIG. 13. Further, the management server 13C includes a determination section 132C, which executes processing functions according to the second modification, in place of the determination section 132B depicted in FIG. 13. Furthermore, a retention section (setting information storage section) 134C additionally includes the air amount setting table 134d.

Referring to FIG. 17, reference characters identical with those in FIG. 13 denote elements identical with or similar to those depicted in FIG. 13. Such elements are not redundantly described.

The second modification is described on the assumption that a plurality of fans 21 (for example, nine fans) are divided into three groups, namely, the first to third groups (groups F1 to F3), as depicted in FIG. 18. When the VMs are to be extraordinarily shifted to a particular region, the VM management section 135 selects one of server groups in regions related to the three groups depicted in FIG. 18 as a target region.

First of all, the air amount setting table 134d is described.

The air amount setting table 134d is an exemplary list of setting information for managing the flow rate of the air current generated by each of the groups.

As depicted in FIG. 19, the air amount setting table 134d includes information about a group ID of a group on which the load is centralized by the VM management section 135 and information about the percentage (%) of a rotation speed (air amount) that is set for the fans 21 in a group when the load is centralized on the group. The air amount setting table 134d also includes information about the open/close status that is set for the shields 22 in a group when the load is centralized on the group.

As an example, the rotation speed (%) "F1:90, F2:75, F3:0" and the shield open/close status "F1:0, F2:0, F3:1" are related to the load-centralized group ID "group00". In the example of FIG. 19, the shield open/close status "0" represents a setting for opening the shields 22 and the shield open/close status "1" represents a setting for closing the shields 22.

In accordance with the retained air amount setting table 134d, the management server 13C is capable of controlling the flow rate of the air current generated from each of the groups.

When, for example, the data center 1 is built, the air amount setting table 134d is prepared or updated, for example, by an administrator of the data center 1 or of the management server 13C.

When the VM management section 135 shifts the load in accordance with the group management table 134c, the determination section 132C controls, on an individual group basis, the flow rate of the air current generated from each of the fans 21, as is the case with the determination section 132B.

In the above instance, the determination section 132C locates the most highly loaded group among groups F1 to F3 (see FIG. 18) in accordance with the status information about each server 12, which is acquired by the status acquisition section 131, or with the information about a region on which the load is centralized by the VM management section 135.

Further, the determination section 132C references the air amount setting table 134d to acquire the setting information about the rotation speed of the fans 21 and the open/close status of the servers 12 that are related to the group ID of the located group.

Furthermore, the determination section 132C instructs the air amount control section 133 to exercise control in such a manner as to increase or decrease the flow rate of the air current generated from the fans 21 in accordance with the acquired setting information.

As described above, the management server 13C according to the second modification is capable of producing the same advantageous effects as the embodiment or the first modification.

Further, the management server 13C is capable of controlling the fans 21 and the shields 22 with ease in accordance with a predetermined air amount setting table 134d. This makes it possible to reduce the load on the management server 13C and perform processing operations at high speed.

The above-described control exercised by the management server 13C may be similarly exercised over electronic devices installed outside a rack 11 and over the fans 21 and shields 22 related to such electronic devices.

Calculations of the settings in the air amount setting table 134d are now described with reference to FIGS. 18 to 21.

Figure 21:
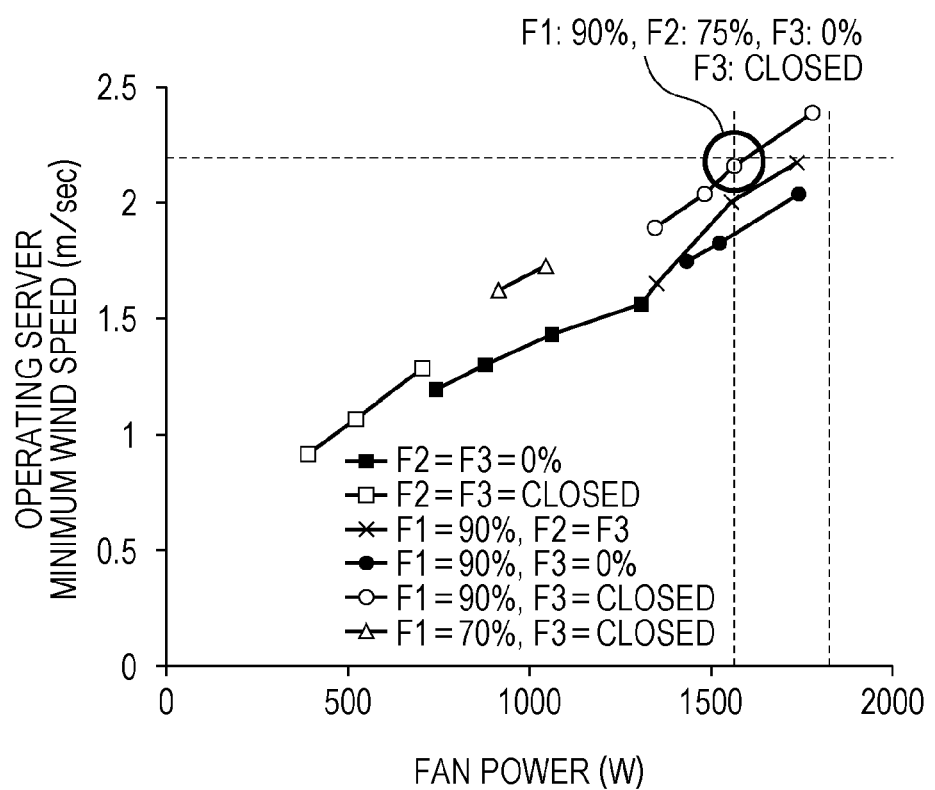
FIG. 21 is a diagram illustrating the minimum wind speed relative to each server that is calculated from the simulation model depicted in FIG. 20.

FIG. 20 is a diagram illustrating a simulation model that is used to calculate a combination of settings in the air amount setting table 134d depicted in FIG. 19. FIG. 21 is a diagram illustrating the minimum wind speed relative to each server 12 that is calculated from the simulation model depicted in FIG. 20.

For the sake of brevity, FIG. 20 does not depict the outer wall of the container 10, the air conditioner 20, the shields 22, or the depth of the servers 12 (racks 11).

The simulation model depicted in FIG. 20 is based on a container-type data center 1 that matches conditions (I) to (VI) below:

(I) Three racks 11 on which forty rack-mount servers are mounted are used (a total of 120 servers 12 are used).

(II) Three air conditioners 20 are used (each air conditioner 20 is positioned to face a rack 11).

(III) The cold aisle and the hot aisle are partitioned from each other by a wall.

(IV) Nine fans 21 are used for each air conditioner 20.

(V) The load imposed by the VMs is ⅓ the maximum value of all servers 12. The VM management section 135 shifts the load so that the load is extraordinarily shifted to the upper ⅓ of the servers 12 on a rack 11 related to the first group (F1) while the lower ⅔ of the servers 12 are idle.

(VI) When fans 21 are stopped, their openings 21a are shielded.

Under the preconditions described above, the rotation speed of the fans 21 in each of the three groups (F1 to F3) was varied. Consequently, the relationship between the minimum wind speed of the air supplied to operating servers 12 in the upper ⅓ region and the resulting electrical power consumption of the fans 21 was determined as depicted in FIG. 21.

As is obvious from FIG. 21, a combination that supplies an adequate amount of cooling air to the operating servers 12 and reduces the amount of electrical power consumption is as indicated in the air amount setting table 134d of FIG. 19. In other words, when the load is centralized on servers related to the first group (F1), it is obvious that the most appropriate combination is obtained by selecting a rotation speed of 90% for the fans 21 in the first group, selecting a rotation speed of 75% for the fans 21 in the second group, and stopping the fans 21 in the third group with their openings 21a shielded.

The settings depicted in FIG. 19 vary, for example, with the arrangement of the fans 21 at the data center 1, the configuration of the data center 1, and the arrangement of the racks 11. However, the air amount setting table 134d may be generated through the above-described simulation.

Figure 22:
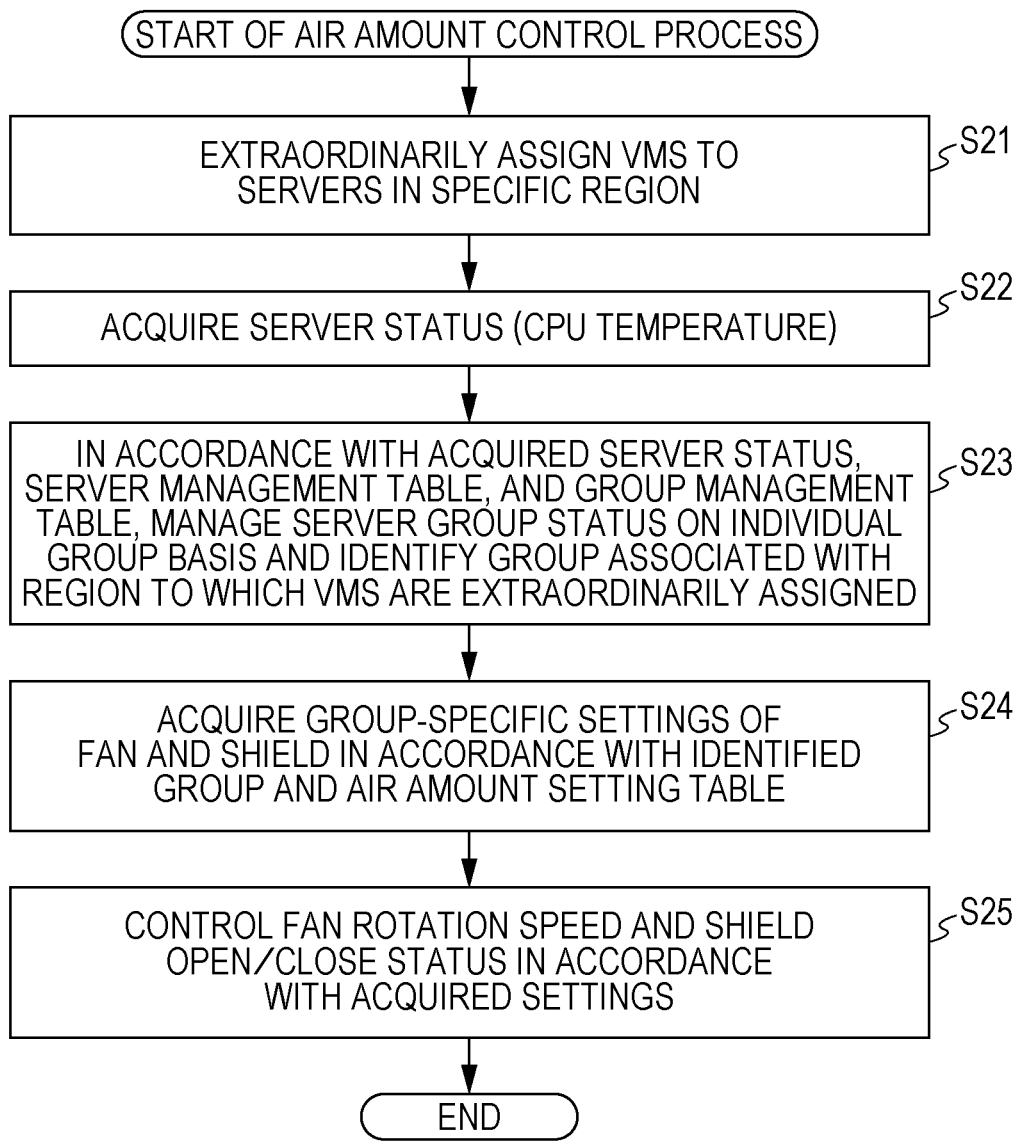
FIG. 22 is a flowchart illustrating the second modification of the air amount control process for the air conditioner installed at the container-type data center depicted in FIG. 1.
Figure 23:
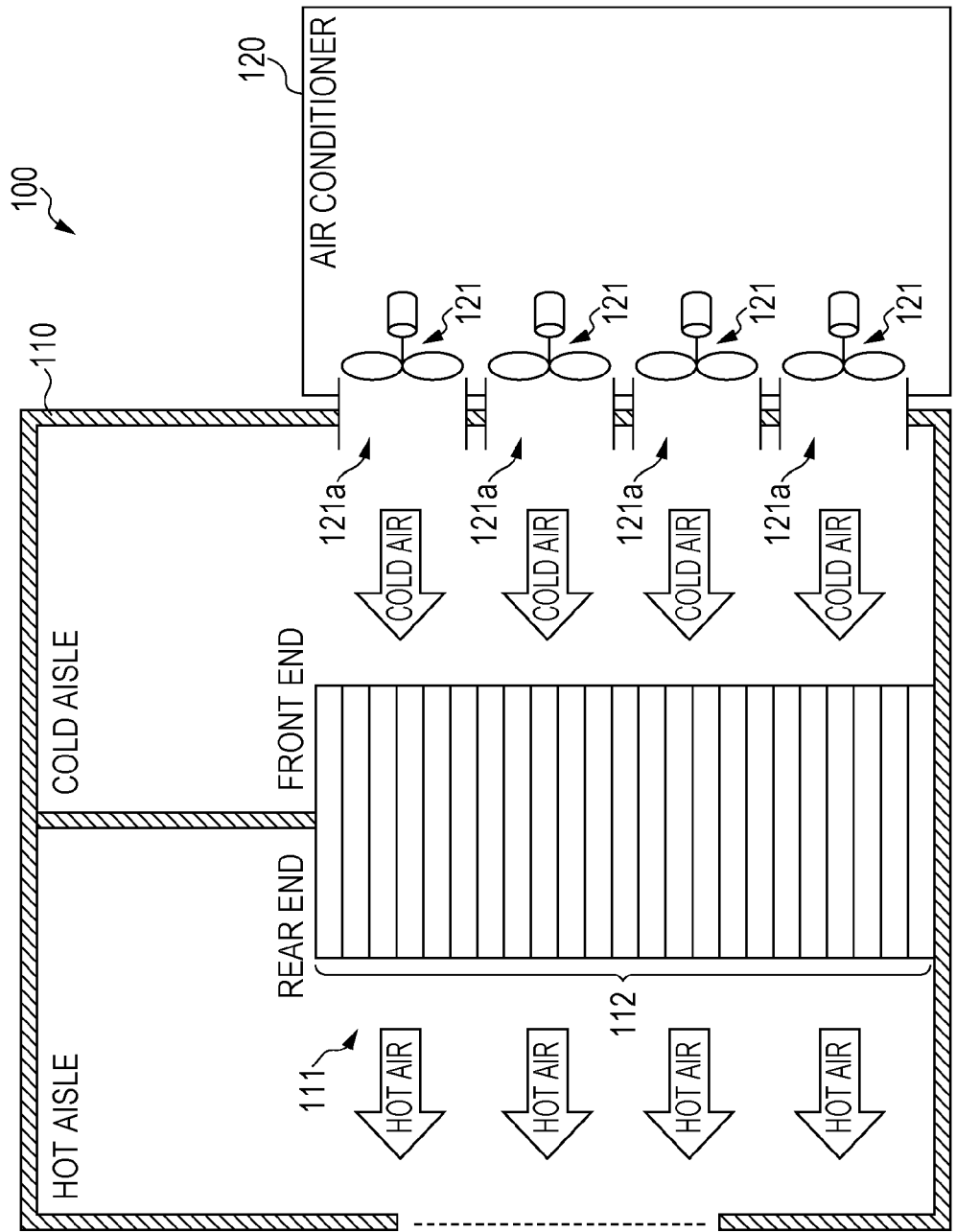
FIG. 23 is a diagram illustrating an exemplary configuration of a container-type data center.

The air amount control process for the air conditioner 20 at the data center 1 according to the second modification, which is configured as described above, is now described with reference to FIG. 22. FIG. 22 is a flowchart illustrating the second modification of the air amount control process for the air conditioner 20 at the data center 1 depicted in FIG. 1.

As depicted in FIG. 22, the VM management section 135 extraordinarily shifts the VMs to servers in a particular region (operation S21).

Next, the status acquisition section 131 acquires the status information about the servers 12 (for example, the CPU temperature) through the communication line 1c (operation S22). The acquired status information and the IDs of the servers 12 are conveyed to the determination section 132C.

The determination section 132C references the server management table 134a and the group management table 134c and manages the conveyed status information about each server 12 for each server group related to a group of fans 21. Then, in accordance with the status information about each server group, the determination section 132C locates a group related to the region to which the load is extraordinarily shifted (operation S23). In this instance, the determination section 132C is able to determine a group of servers having, for example, the highest status information (for example, the highest CPU temperature or CPU usage rate) as the servers 12 in the region to which the VMs are extraordinarily shifted, and locate the related group.

Further, in accordance with the located group and with the air amount setting table 134d, the determination section 132C acquires the settings of the fans 21 and shields 22 in each group (operation S24).

The determination section 132C then instructs the air amount control section 133 to exercise control over each group in such a manner as to set the rotation speeds of the fans 21 and open or close the shields 22 in accordance with the acquired settings.

The air amount control section 133 controls the fans 21 and the shields 22 in accordance with the settings designated by the determination section 132C (operation S25). Upon completion of operation S25, processing comes to an end.

As described above, the air amount control process for the air conditioner 20 at the data center 1 according to the second modification is brought to an end.

The management server 13C is able to perform the air amount control process depicted in FIG. 22 each time it acquires the status information from the individual servers 12.

Referring to FIG. 22, the determination section 132C may, instead of performing operations S22 and S23, acquire from the VM management section 135 the information about the servers in the region to which the load is extraordinarily shifted, and locate the group in accordance with the acquired information.

[4] Other

While the embodiments have been described above, it is to be understood by those skilled in the art that these embodiments are offered by way of example only, and that various changes in form and details may be made without departing from the spirit and scope of the appended claims.

For example, the foregoing description is given on the assumption that the fans 21 and shields 22 according to the embodiment and to the first and second modifications are provided for the air conditioner 20. However, the use of such a configuration has been described by way of example only. Alternatively, the fans 21 and the shields 22 may be provided for the container 10. When such an alternative is employed, the data center 1 may be configured so as to include at least the container 10 while the air conditioner 20 is installed separately.

The above alternative permits an air conditioner 20 having a high cooling capability to be shared by a plurality of data centers 1 and makes it possible to use existing air conditioners 20. This provides enhanced convenience and reduces the cost of equipment investment.

Further, the foregoing description is given on the assumption that at least one of the servers 12 is used as the management server 13 according to the embodiment and to the first and second modifications. However, the use of such a configuration has been described by way of example only. For example, a control device (control section) having the functions of the management server 13 may alternatively be disposed in the container 10 in addition to the servers 12. Even when such an alternative is employed, the control device is connected to the fans 21, the shields 22, and the electronic devices, such as the servers 12, through the control lines 1a, 1b and the communication line 1c. In this instance, the control device includes a CPU or other processor and functions as the management server 13 by allowing the processor to execute a control program.

The above alternative makes it possible to enhance the usability of the servers 12 because none of the servers available to the user is used as the management server 13. In addition, the personnel who operates or manages the data center 1 is not requested to use a server 12 available to the user for the purpose of building the management server 13. This provides improved workability and maintainability. Besides, the control device having the functions of the management server 13 may be incorporated in the container 10 in advance. Therefore, a higher degree of convenience may be provided for both the user and the personnel than when the management server 13 is built before the data center 1 begins to provide services.

Furthermore, the management servers 13B, 13C according to the first and second modifications may alternatively determine the fans 21 to be subjected to air amount increase control or decrease control in accordance with the information about the servers in a region on which the load is centralized by the VM management section 135 and without using the CPU temperature or other status information about each server 12.

In other words, when the VM management section 135 shifts the load to a predetermined group, the management servers 13B, 13C are able to increase the flow rate of the air current generated from the fans 21 in the predetermined group. The management servers 13B, 13C are also able to decrease the flow rate of the air current generated from the fans 21 in each group other than the predetermined group. In this instance, the amount of flow rate decrease increases with an increase in the distance from the predetermined group. Further, if the flow rate of the air current generated from each of the other groups is not higher than a predetermined value (for example, 0), the management servers 13B, 13C are able to select shields 22 related to the fans 21 in the other groups and cause the selected shields 22 to shield the fans 21 (openings 21a) in the other groups.

The above alternative makes it possible to omit a process performed by the status acquisition section 131. Thus, the fans 21 and the shields 22 may be controlled by using a simpler control scheme.

Moreover, when the fans 21 and the shields 22 are to be controlled on an individual group basis, the management servers 13B, 13C according to the first and second modifications may individually control the fans 21 and the shields 22 in accordance with the status information about each server 12, which is acquired by the status acquisition section 131.

The functions of the management servers 13A to 13C according to the embodiment and to the first and second modifications may be executed in any desired combination.

Besides, all or some of the functions of the management servers 13A to 13C according to the embodiment and to the first and second modifications may be implemented by allowing a computer (including a CPU, an information processing device, and various terminals) to execute a predetermined program.

The predetermined program is supplied on a flexible disk, a CD, a DVD, a Blu-ray disc, or other computer-readable recording medium (for example, the recording medium 12h depicted in FIG. 5). A CD-ROM, a CD-R, a CD-RW, or the like may be used as the CD. A DVD-ROM, a DVD-RAM, a DVD-R, a DVD-RW, a DVD+R, a DVD+RW, or the like may be used as the DVD. In the above instance, the computer reads the program from the recording medium and transfers the program to an internal storage device or an external storage device for storage purposes before using the program.

The term "computer" is a concept including hardware and an operating system (OS) and denotes hardware running under the control of the OS. If an application program independently operates the hardware without the aid of the OS, the hardware itself corresponds to the computer. The hardware includes at least a CPU or other microprocessor and a reader that reads a computer program recorded on the recording medium. The above-mentioned program includes program codes that cause the above-described computer to implement the functions of the management servers 13A to 13C according to the embodiment and to the first and second modifications. Some of the functions may be implemented by the OS instead of the application program.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A data center that has a cold aisle and a hot aisle, the data center comprising:
    a plurality of computers located between the cold aisle and the hot aisle;
    an air conditioner including a plurality of fans that respectively supply air flow to the plurality of computers through one of a plurality of openings provided at a wall between the cold aisle and the air conditioner, the plurality of fans being positioned so as to face the plurality of computers;
    shutters respectively provided for the plurality of openings, each of the shutters being configured to open or cover a corresponding one of the plurality of openings; and
    a processor included in one of the plurality of computers and configured to:
        control the air flow supplied from each of the plurality of fans in accordance with computer management information in which an identifier of a computer, a position of the computer in a rack that stores the plurality of computers and separates the cold aisle and the hot aisle, and one or more identifiers of fans corresponding to the computer are associated with each other for each of the plurality of computers;
        acquire status information indicating status of a specified computer among the plurality of computers;
        specify a fan, among the plurality of fans, corresponding to the specified computer;
        determine whether a temperature of the specified computer is lower than a threshold;
        decrease rotation speed of the specified fan, when it is determined that the temperature of the specified computer is lower than the threshold;
        cover an opening corresponding to the specified fan among the plurality of openings using a shutter of the shutters to cover the opening, when the specified fan is stopped by decreasing the rotation speed;
        divide the plurality of fans into a plurality of groups based on height positions of the plurality of fans;
        select, among the plurality of computers, computers corresponding to fans in a predetermined one of the groups in accordance with the computer management information;
        cause the selected computers to execute a process to be executed by the plurality of computers; and
        control the air flow generated from each of the plurality of fans on an individual group basis in accordance with the status information and with the computer management information.

2. The data center according to claim 1,
    wherein the processor is configured to:
        increase rotation speed of one or more fans corresponding to a computer of which internal temperature or operating rate is higher than a first predetermined value so as to increase flow amount of the air flow, based on the status information, and
        decrease rotation speed of one or more fans corresponding to a computer of which internal temperature or operating rate is lower than a second predetermined value so as to decrease flow amount of the air flow, based on the status information.

3. The data center according to claim 1, wherein the processor is further configured to:
  increase a flow rate of the air flow generated from the fans in the predetermined group,
  decrease the flow rate of the air flow generated from fans in groups other than the predetermined group on an individual group basis, the amount of flow rate decrease increasing with an increase in a distance from the predetermined group, and
  cause shutters corresponding to fans in the other groups to cover openings of the plurality of openings corresponding to the fans in the other groups when the flow rate of the air flow generated from each of the other groups is not higher than the predetermined value.

4. The data center according to claim 1, wherein the processor is further configured to:
  store setting information that is used to manage the flow rate of the air flow generated from each of the groups, and
  control the flow rate of the air flow generated from each of the groups in accordance with the stored setting information.

5. The data center according to claim 1,
  wherein the processor is electrically coupled to the plurality of fans and the shutters provided for the plurality of openings; and
  wherein a process of the processor is implemented when the one of the plurality of computers executes a predetermined program.

6. The data center according to claim 4,
  wherein the setting information includes an identifier of a fan, a rotation speed of the fan and shield information indicating whether one of the shutters covers an opening of the plurality of openings corresponding to the fan or not for each of the plurality of fans.

7. The data center according to claim 1,
  wherein the plurality of fans are positioned so as to face front ends of the plurality of computers through the openings.

8. The data center according to claim 1,
  wherein the processor is configured to cover the opening for the stopped fan to prevent that the air flow supplied from the plurality of fans except the stopped fan flows backward from the cold aisle to the air conditioner through the opening for the stopped fan.

* * * * *